(12) United States Patent
Kuo et al.

(10) Patent No.: US 12,294,028 B2
(45) Date of Patent: May 6, 2025

(54) MANUFACTURING METHOD OF SEMICONDUCTOR DEVICE

(71) Applicant: Taiwan Semiconductor Manufacturing Company, Ltd., Hsinchu (TW)

(72) Inventors: Jiun-Ming Kuo, Taipei (TW); Hsin-Chih Chen, New Taipei (TW); Che-Yuan Hsu, Hsinchu (TW); Kuo-Chin Liu, Hualien County (TW); Han-Yu Tsai, Hsinchu (TW); You-Ting Lin, Miaoli County (TW); Jen-Hong Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/494,759

(22) Filed: Oct. 25, 2023

(65) Prior Publication Data

US 2024/0055527 A1 Feb. 15, 2024

Related U.S. Application Data

(62) Division of application No. 17/019,366, filed on Sep. 14, 2020, now Pat. No. 11,830,948.

(60) Provisional application No. 62/978,307, filed on Feb. 19, 2020.

(51) Int. Cl.
| | |
|---|---|
| *H01L 29/78* | (2006.01) |
| *H01L 21/3065* | (2006.01) |
| *H01L 29/66* | (2006.01) |

(52) U.S. Cl.
CPC ...... *H01L 29/7853* (2013.01); *H01L 21/3065* (2013.01); *H01L 29/66795* (2013.01)

(58) Field of Classification Search
CPC .......... H01L 29/7853; H01L 29/66795; H01L 21/3065
See application file for complete search history.

(56) References Cited

U.S. PATENT DOCUMENTS

| 5,963,789 | A | * | 10/1999 | Tsuchiaki | .......... | H01L 21/76264 257/513 |
| 2009/0251845 | A1 | * | 10/2009 | Kiehlbauch | .......... | H10B 12/033 216/6 |
| 2010/0190345 | A1 | * | 7/2010 | Chen | .................. | H01L 21/31116 257/E21.241 |
| 2015/0118849 | A1 | * | 4/2015 | Oda | .................. | H01L 21/30655 438/701 |
| 2019/0043862 | A1 | * | 2/2019 | Chang | ............. | H01L 21/823821 |
| 2021/0167209 | A1 | * | 6/2021 | Liao | ..................... | H01L 27/0886 |

* cited by examiner

*Primary Examiner* — Christine A Enad
(74) *Attorney, Agent, or Firm* — JCIPRNET

(57) ABSTRACT

A method of manufacturing a semiconductor device includes at least the following steps. A protrusion is formed in a substrate by an anisotropic etch process, wherein a sidewall of the protrusion is inclined. A recess is formed on the sidewall of the protrusion by an isotropic etch process, wherein during the isotropic etch process, a by-product covers a first portion of the sidewall of the protrusion while exposing a second portion of the sidewall of the protrusion, so that the recess is formed between the first portion and the second portion of the sidewall.

20 Claims, 18 Drawing Sheets

MANUFACTURING METHOD OF SEMICONDUCTOR DEVICE

CROSS-REFERENCE TO RELATED APPLICATION

This application is a divisional application of and claims the priority benefit of a prior application Ser. No. 17/019,366, filed on Sep. 14, 2020. The prior application Ser. No. 17/019,366 claims the priority benefit of U.S. provisional application Ser. No. 62/978,307, filed on Feb. 19, 2020. The entirety of each of the above-mentioned patent applications is hereby incorporated by reference herein and made a part of this specification.

BACKGROUND

As the semiconductor devices keep scaling down in size, three-dimensional multi-gate structures, such as the fin-type field effect transistor (FinFET), have been developed to replace planar CMOS devices. A characteristic of the FinFET device lies in that the structure has one or more silicon-based fins that are wrapped around by the gate to define the channel of the device. The gate wrapping structure further provides better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
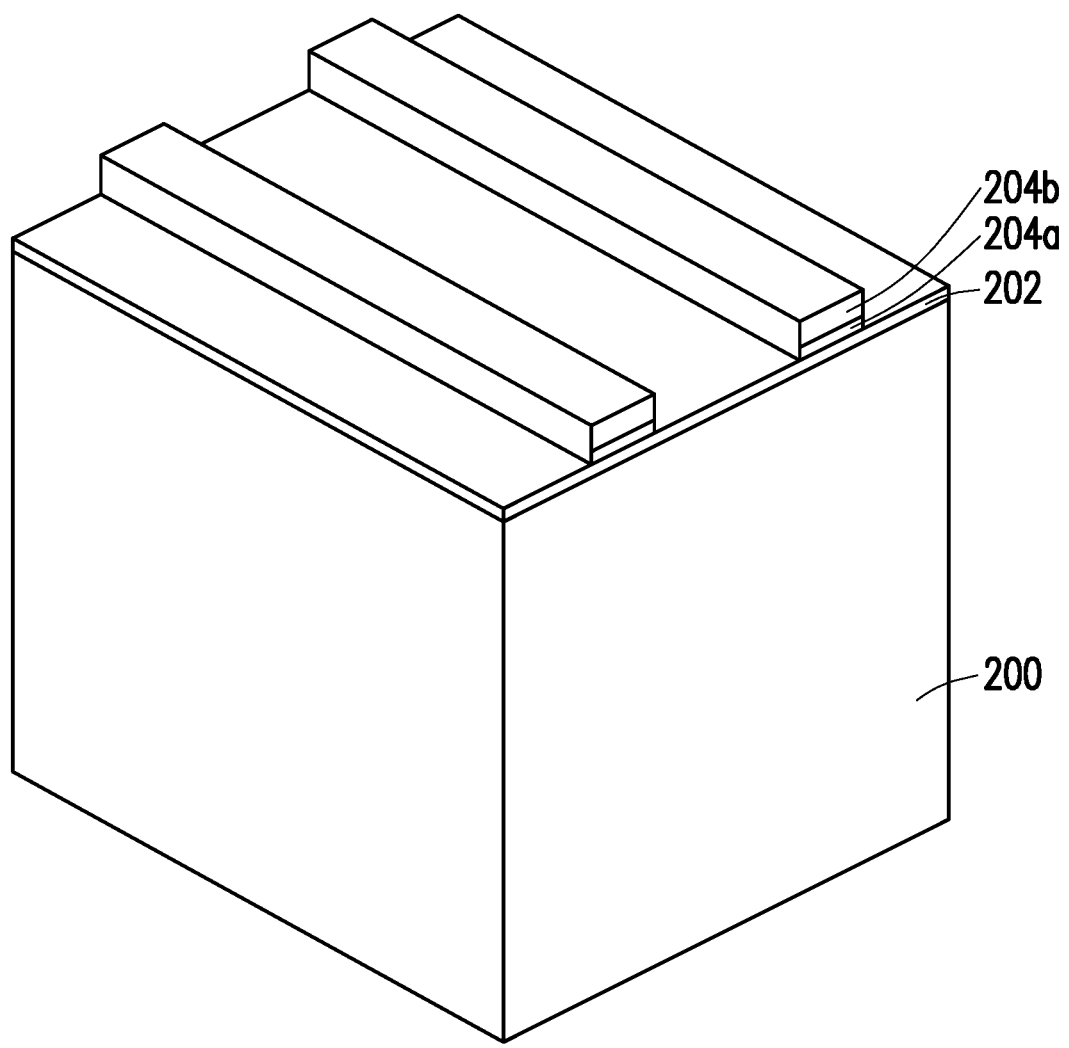
FIG. 1A to FIG. 1Q are perspective view illustrating various stages of a method of manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
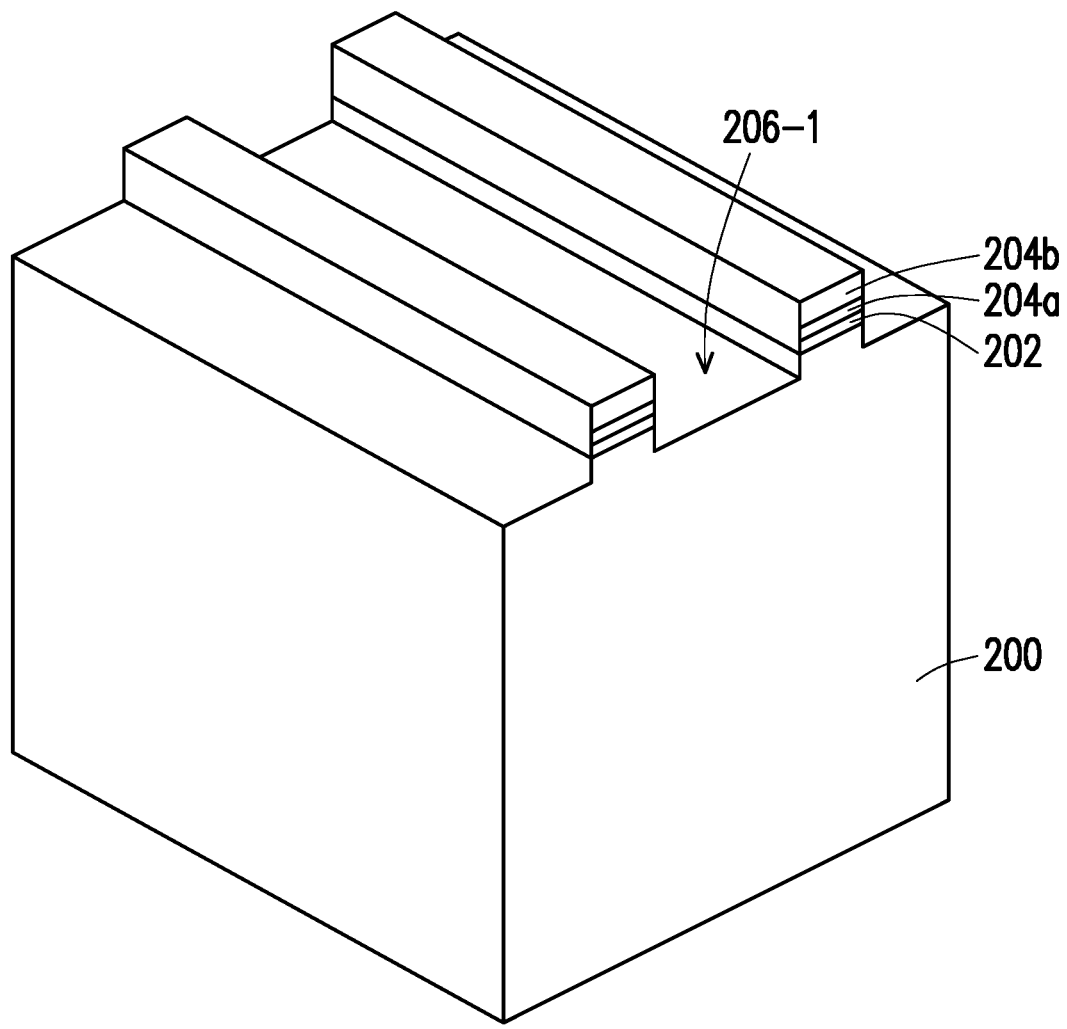
Figure 1C:
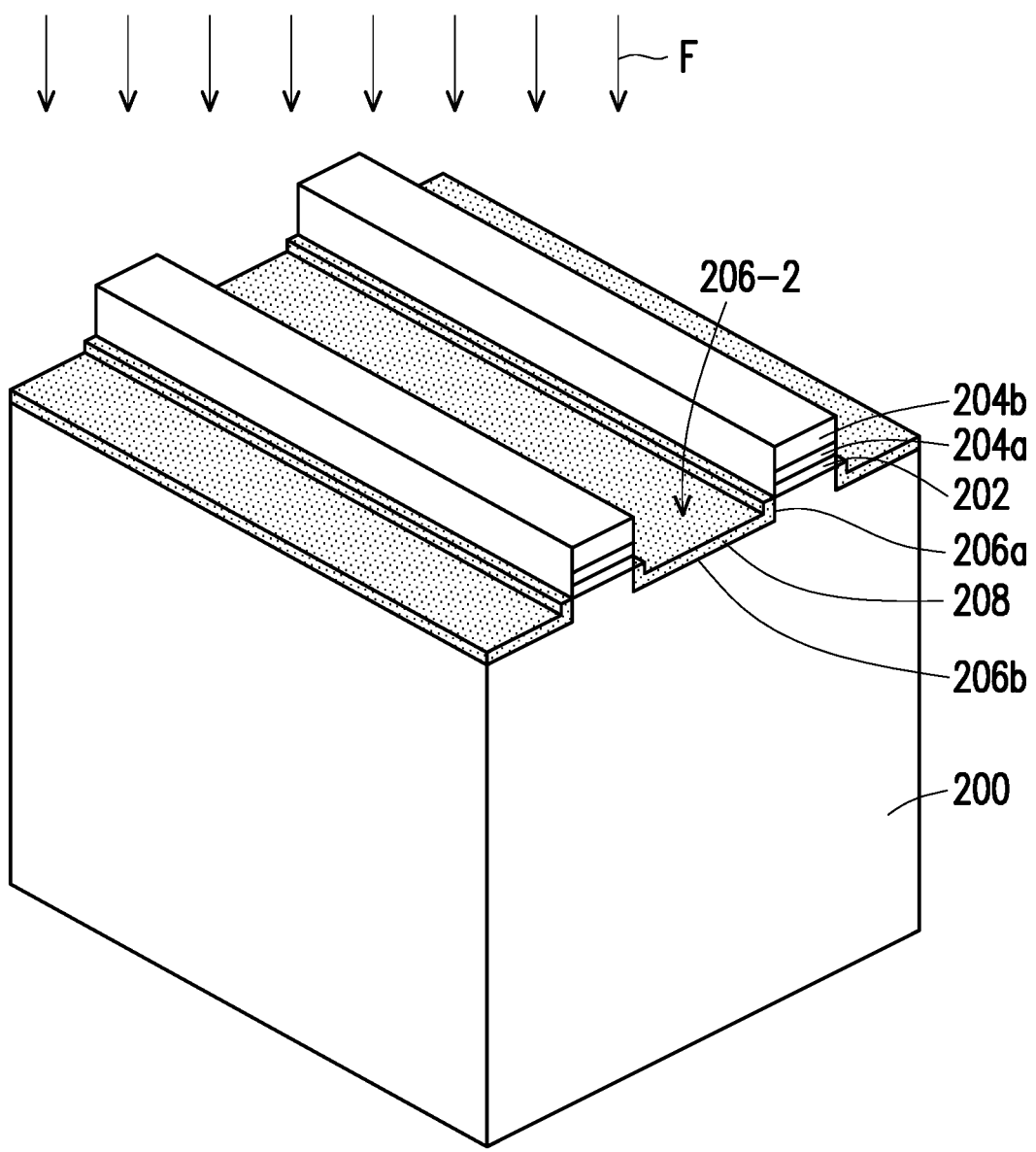
Figure 1D:
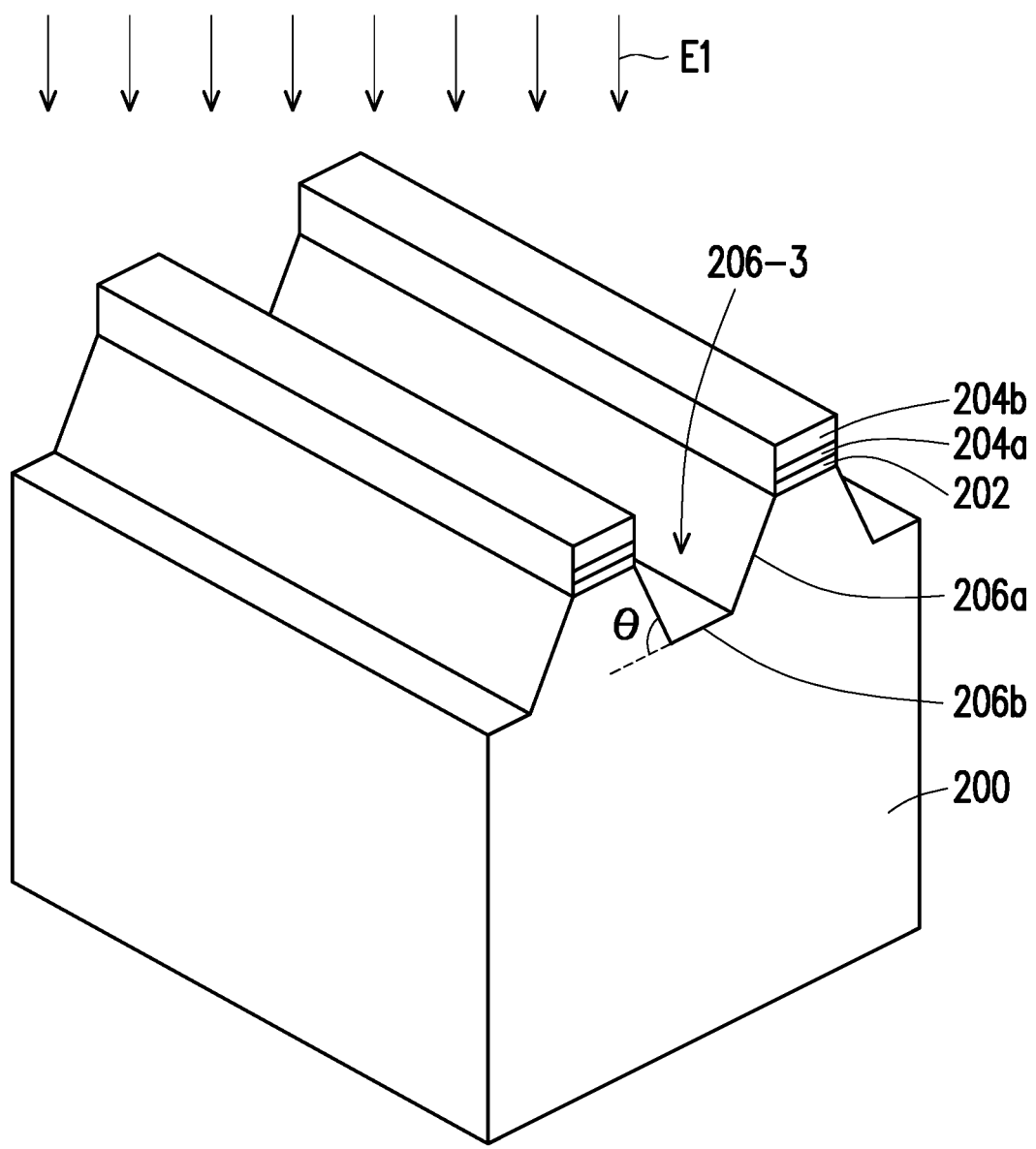
Figure 1E:
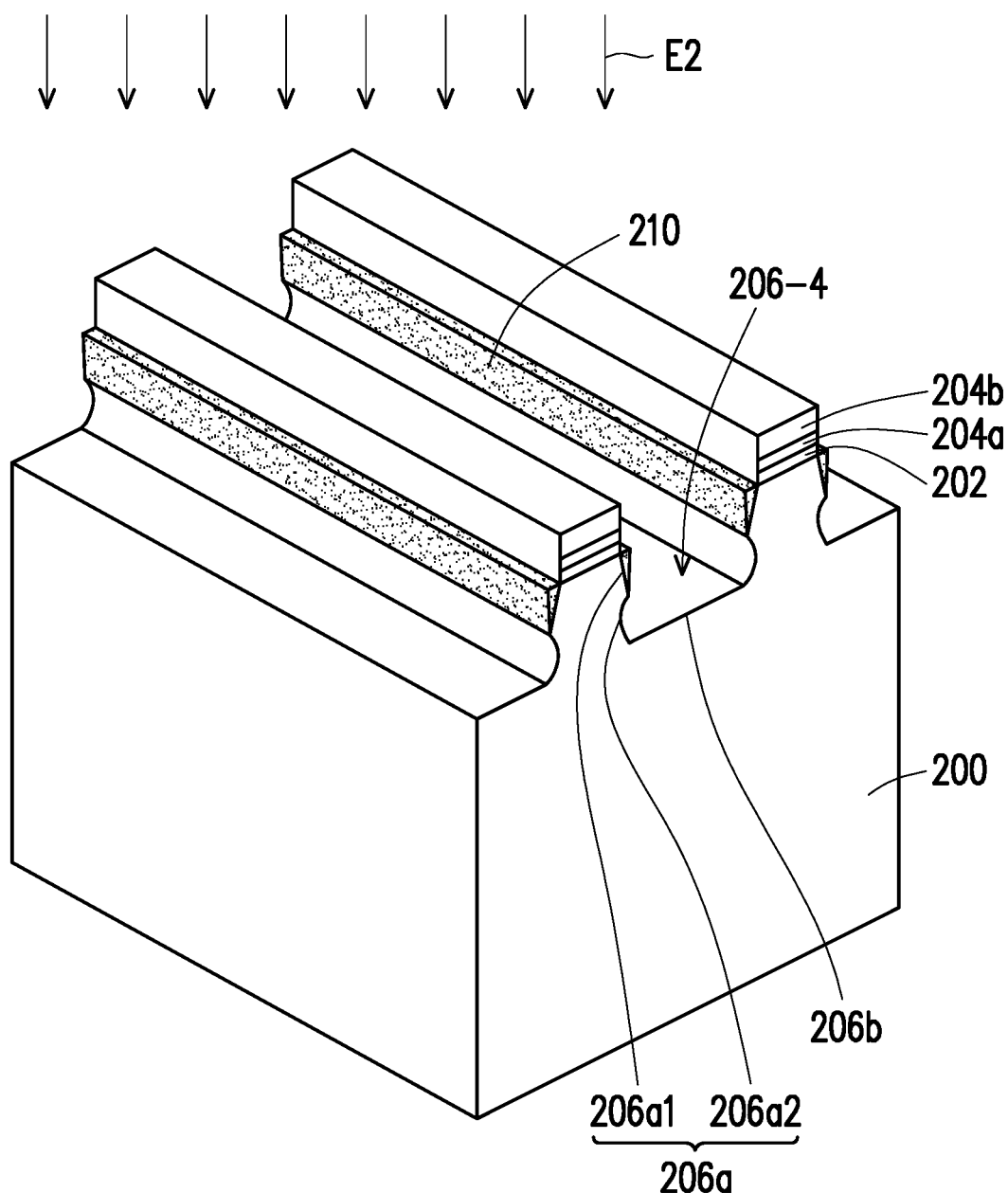
Figure 1F:
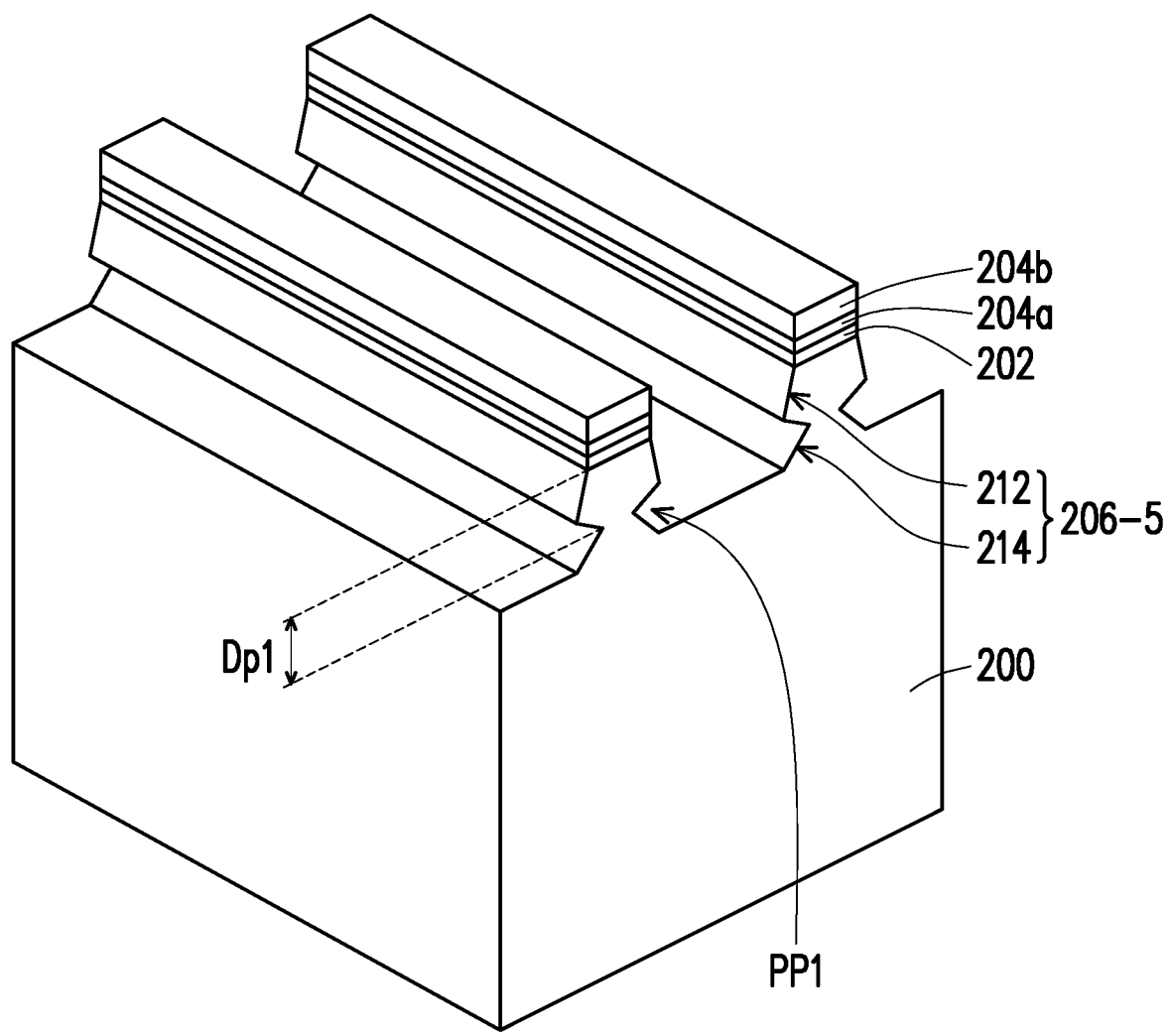
Figure 1G:
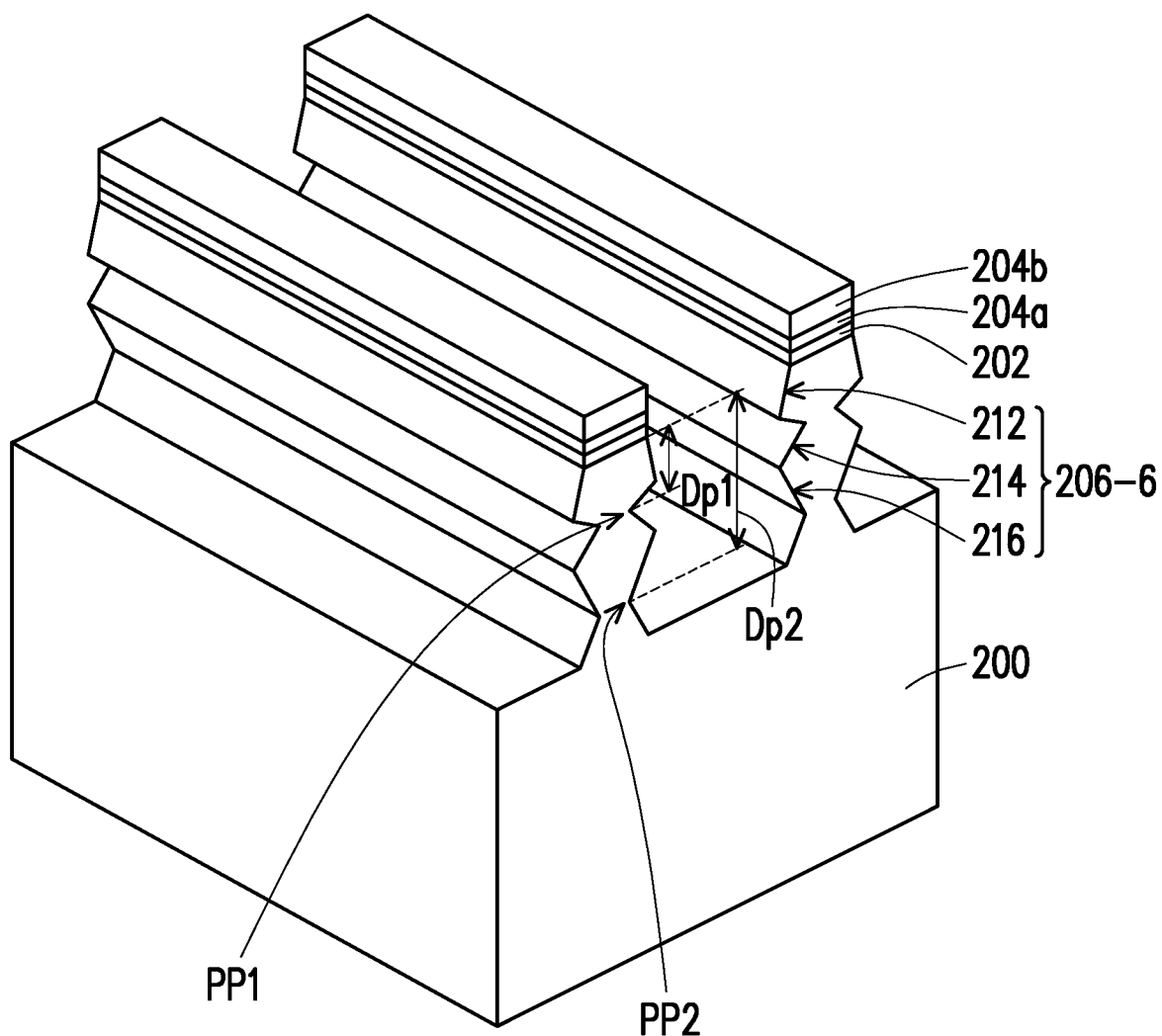
Figure 1H:
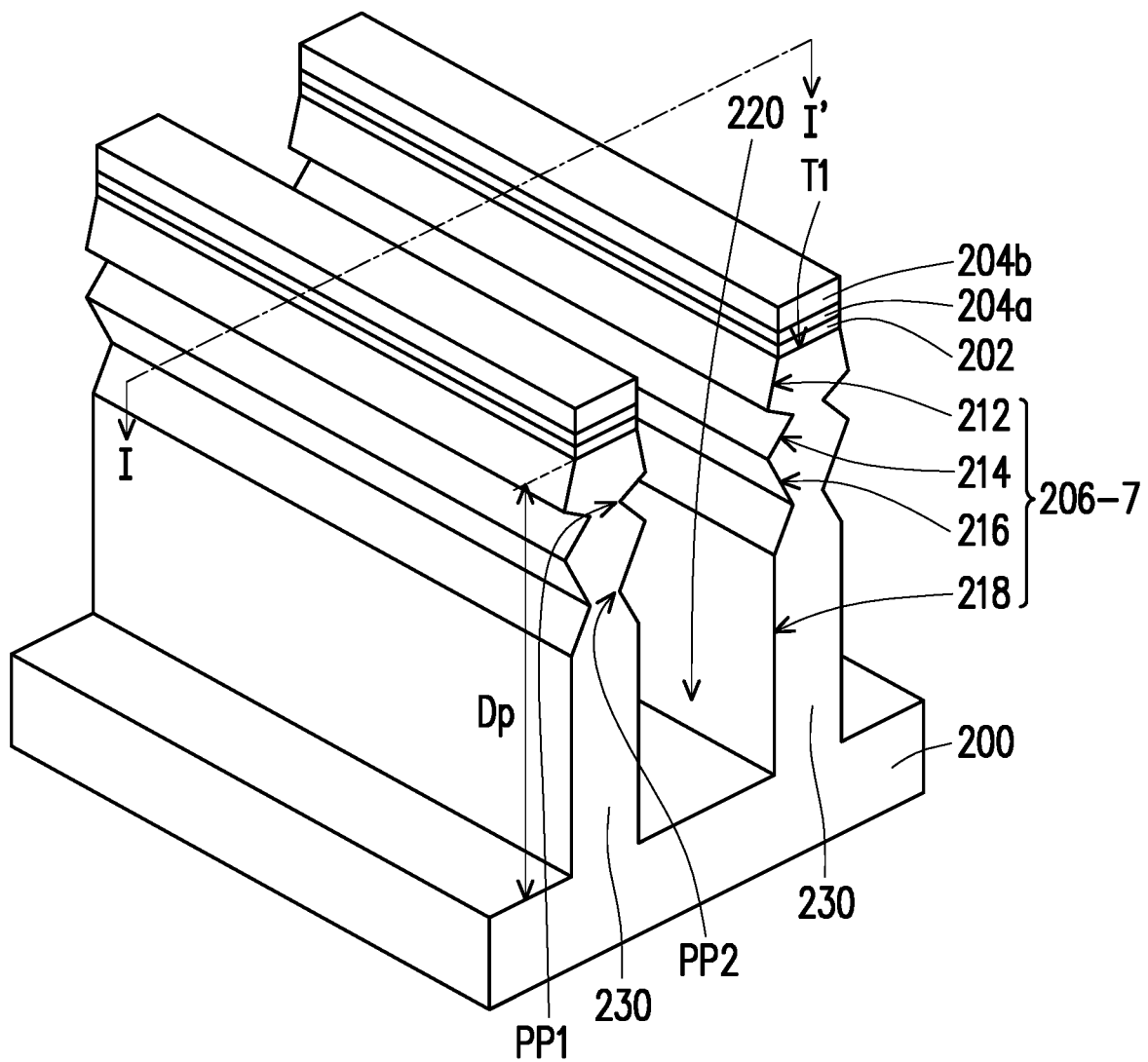
Figure 1I:
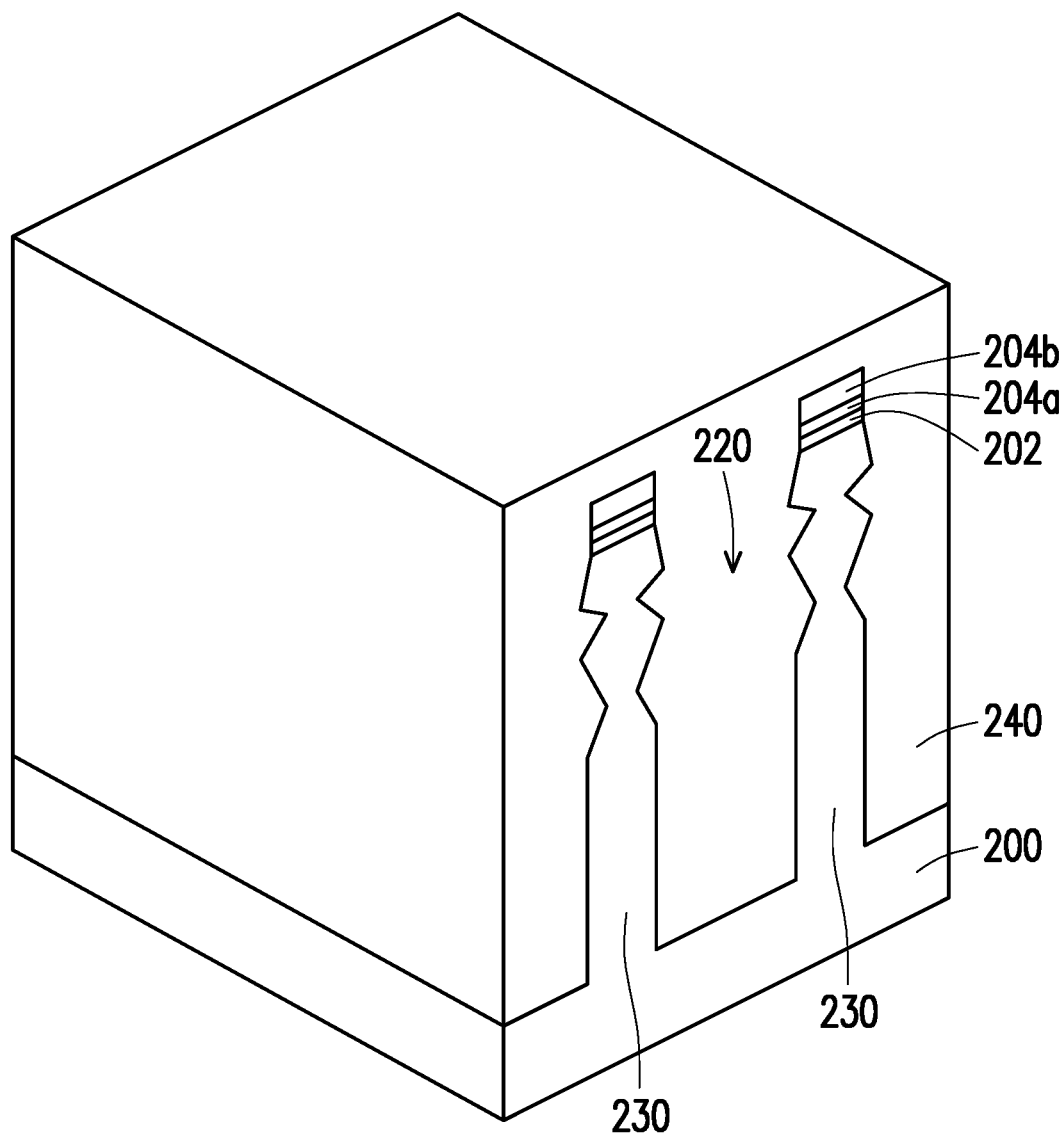
Figure 1J:
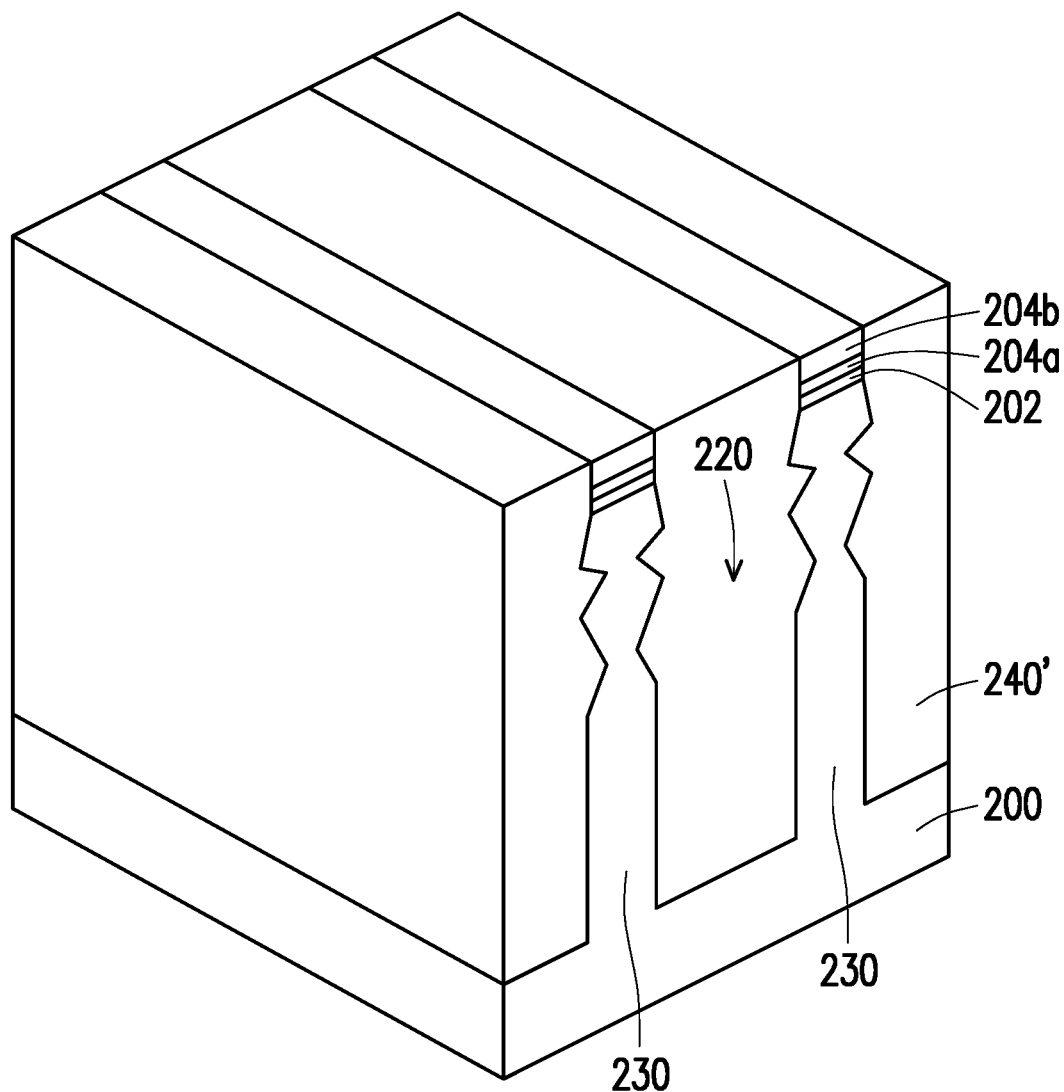
Figure 1K:
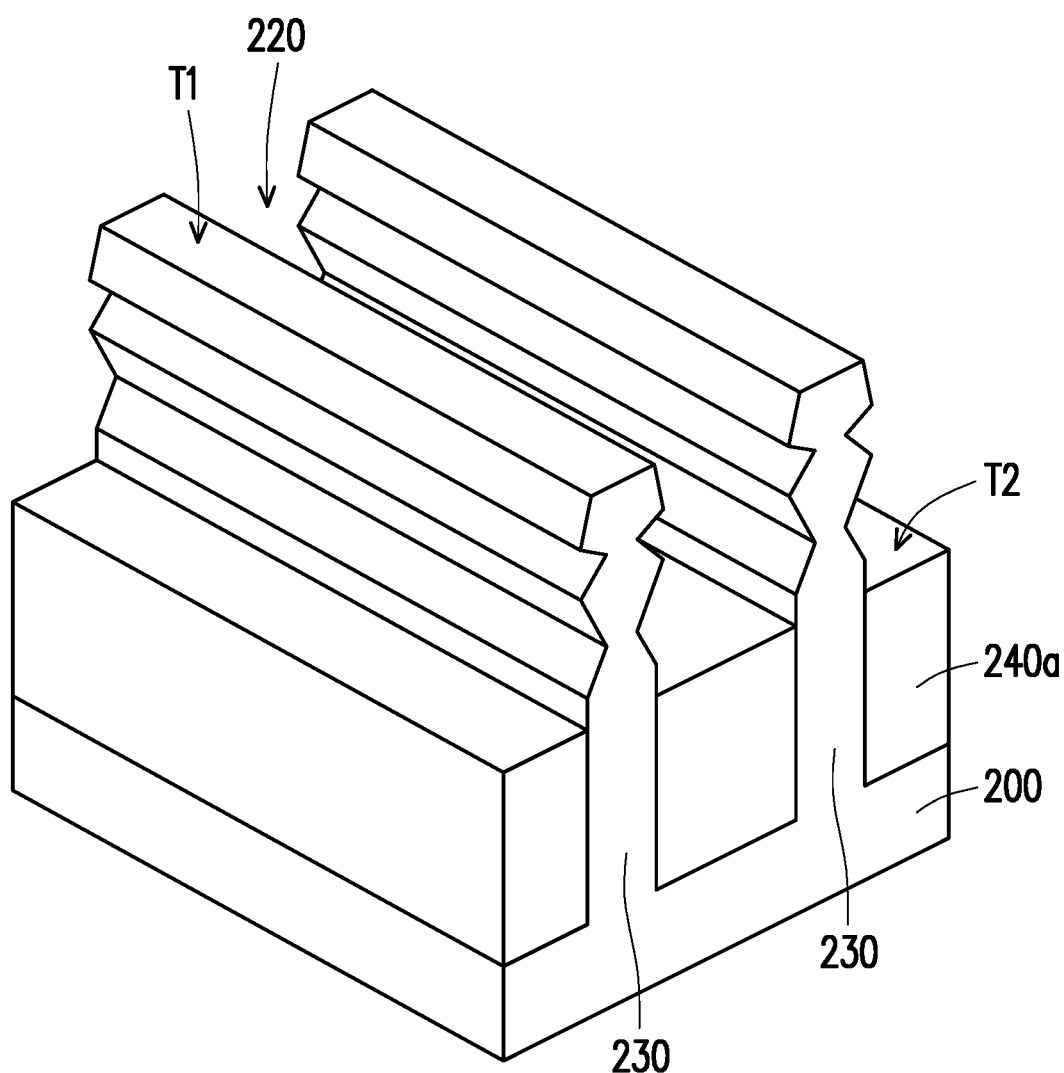
Figure 1L:
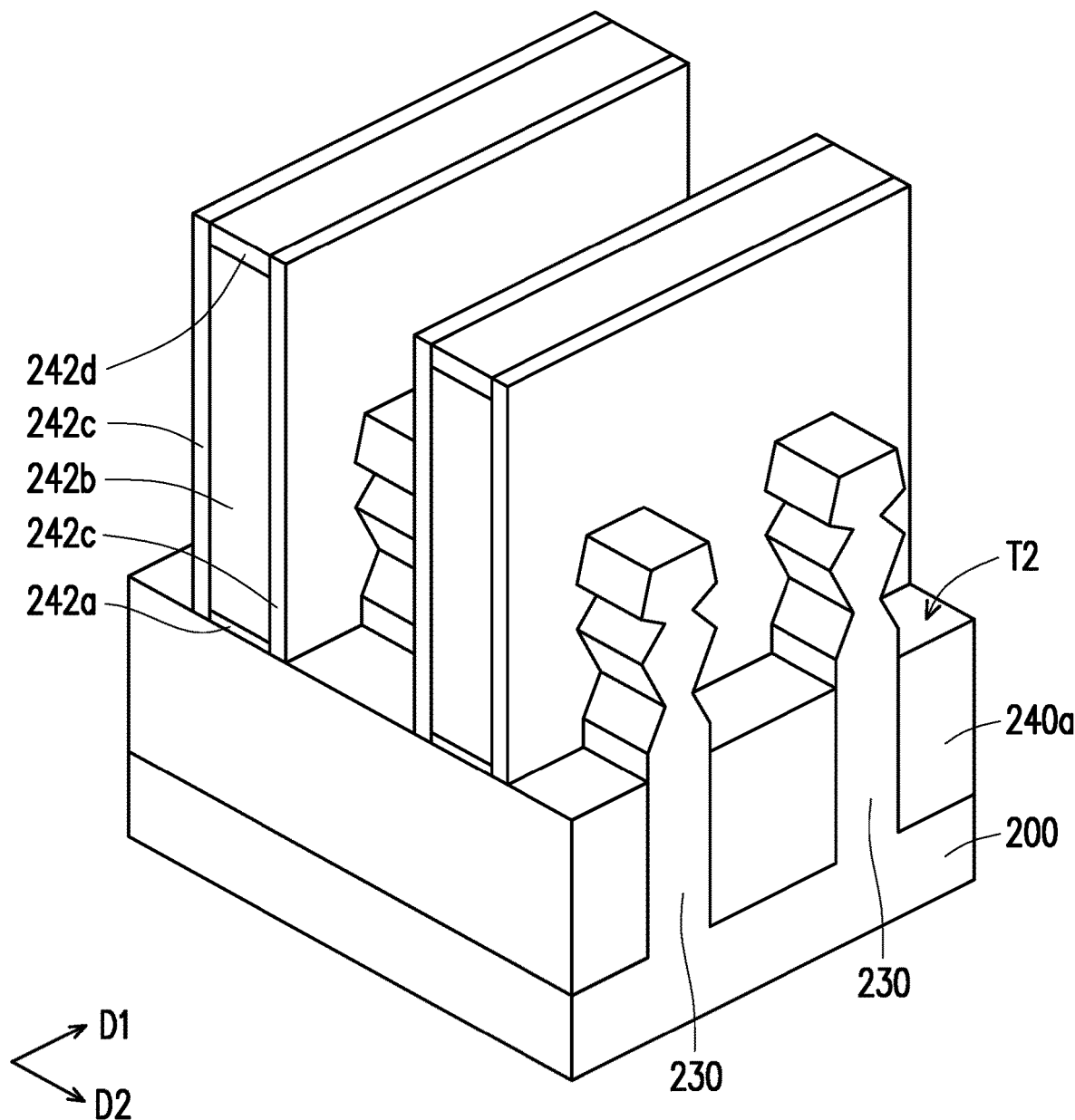
Figure 1M:
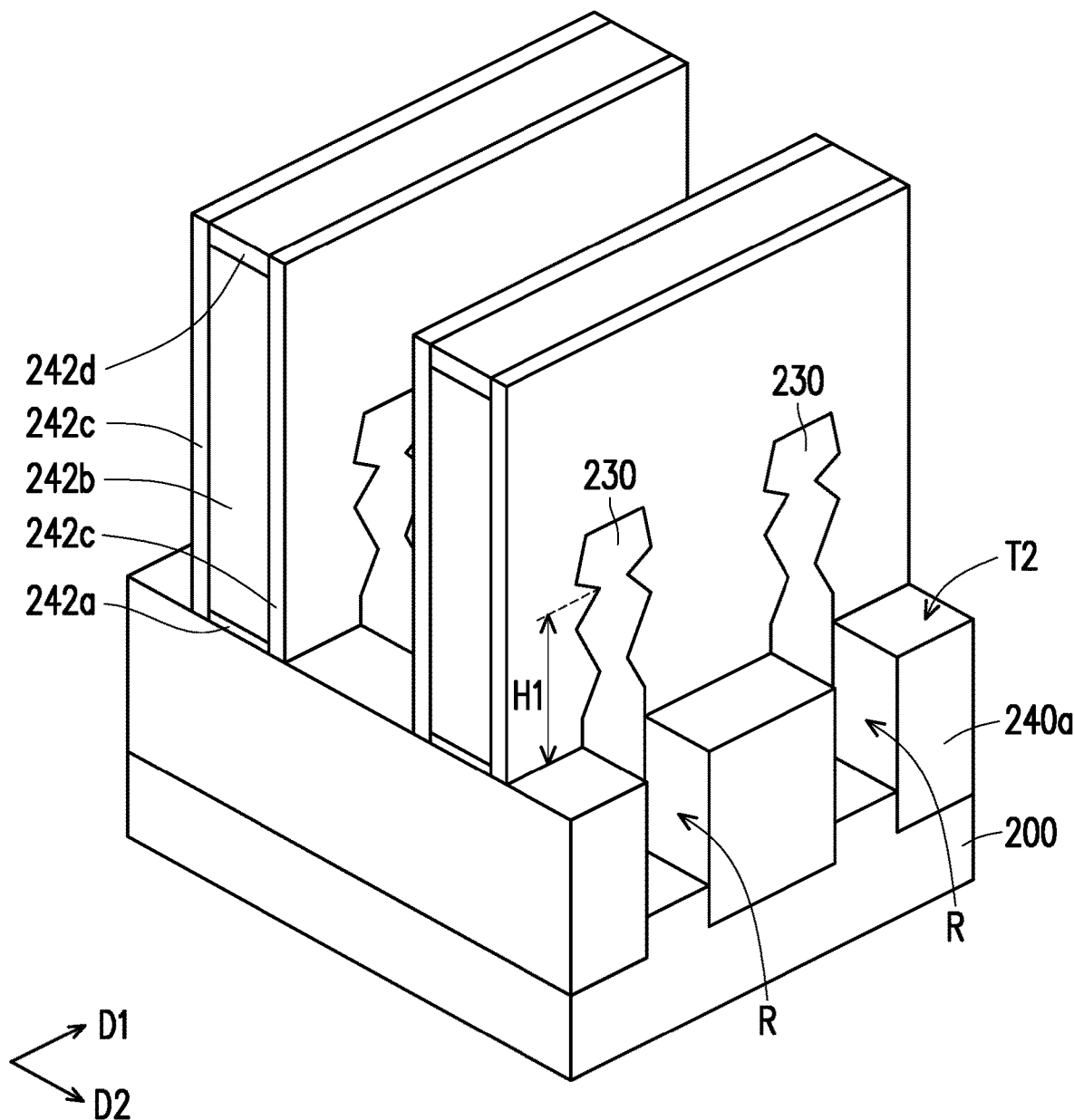
Figure 1N:
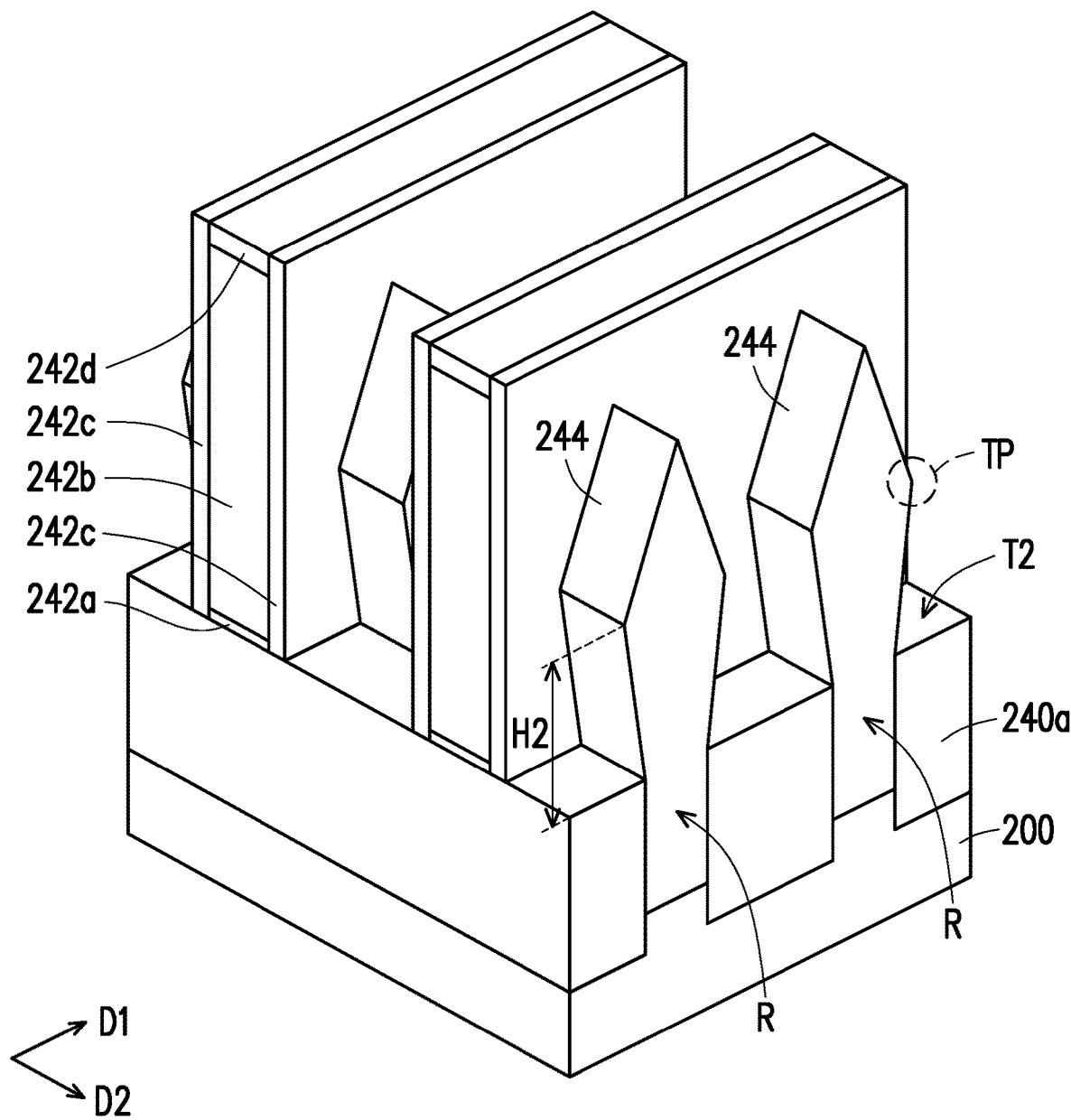
Figure 10:
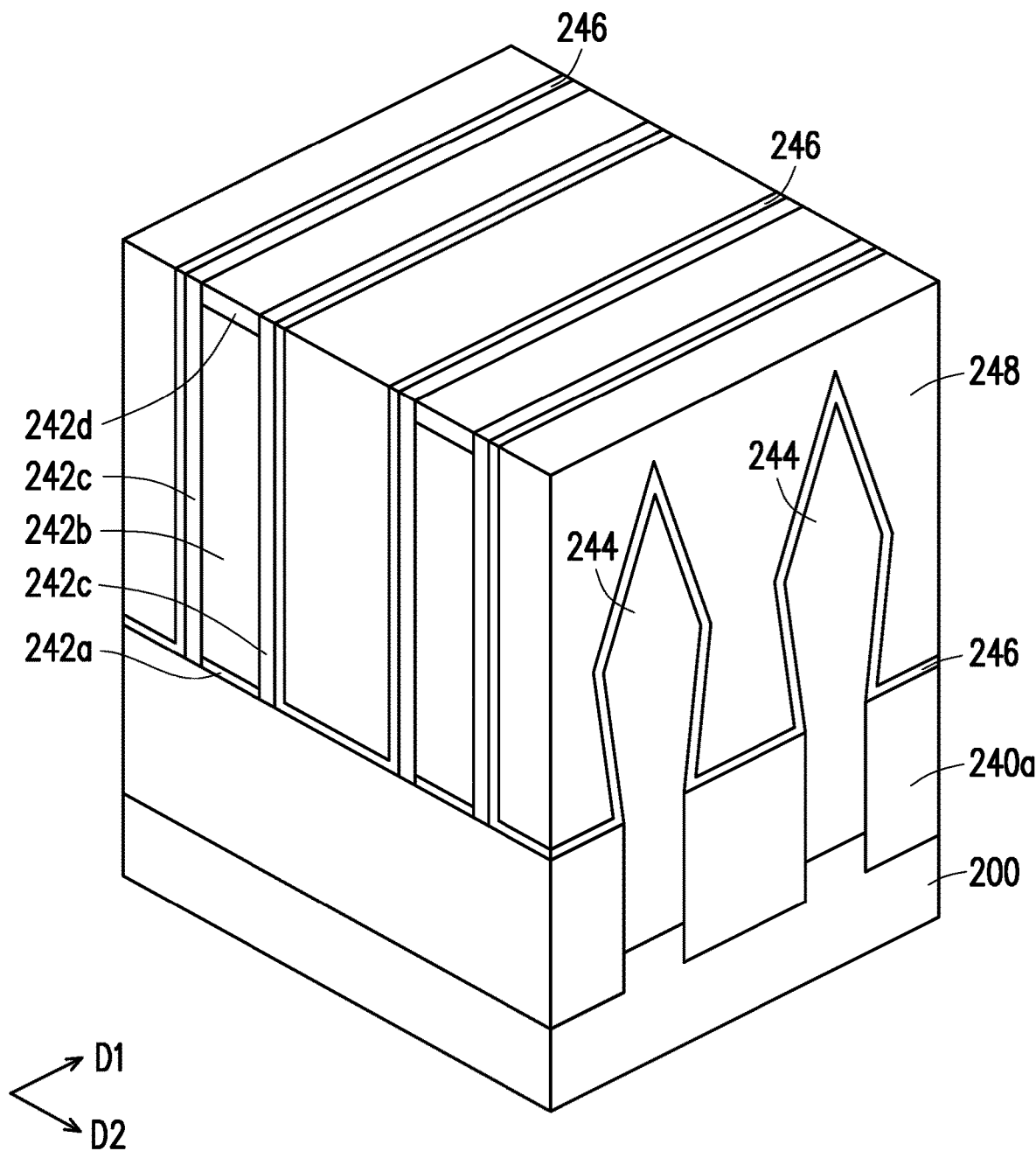
Figure 1P:
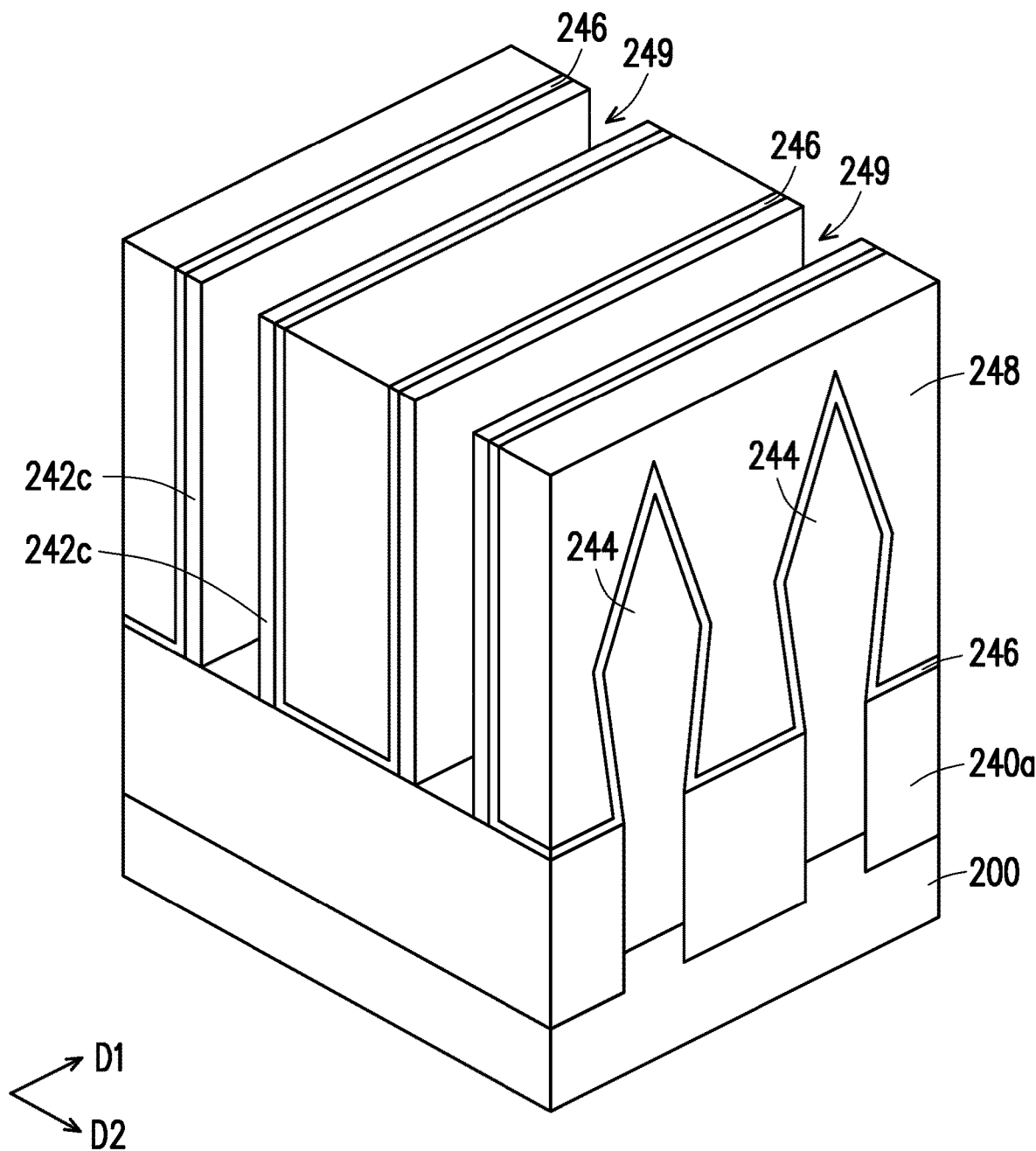
Figure 1Q:
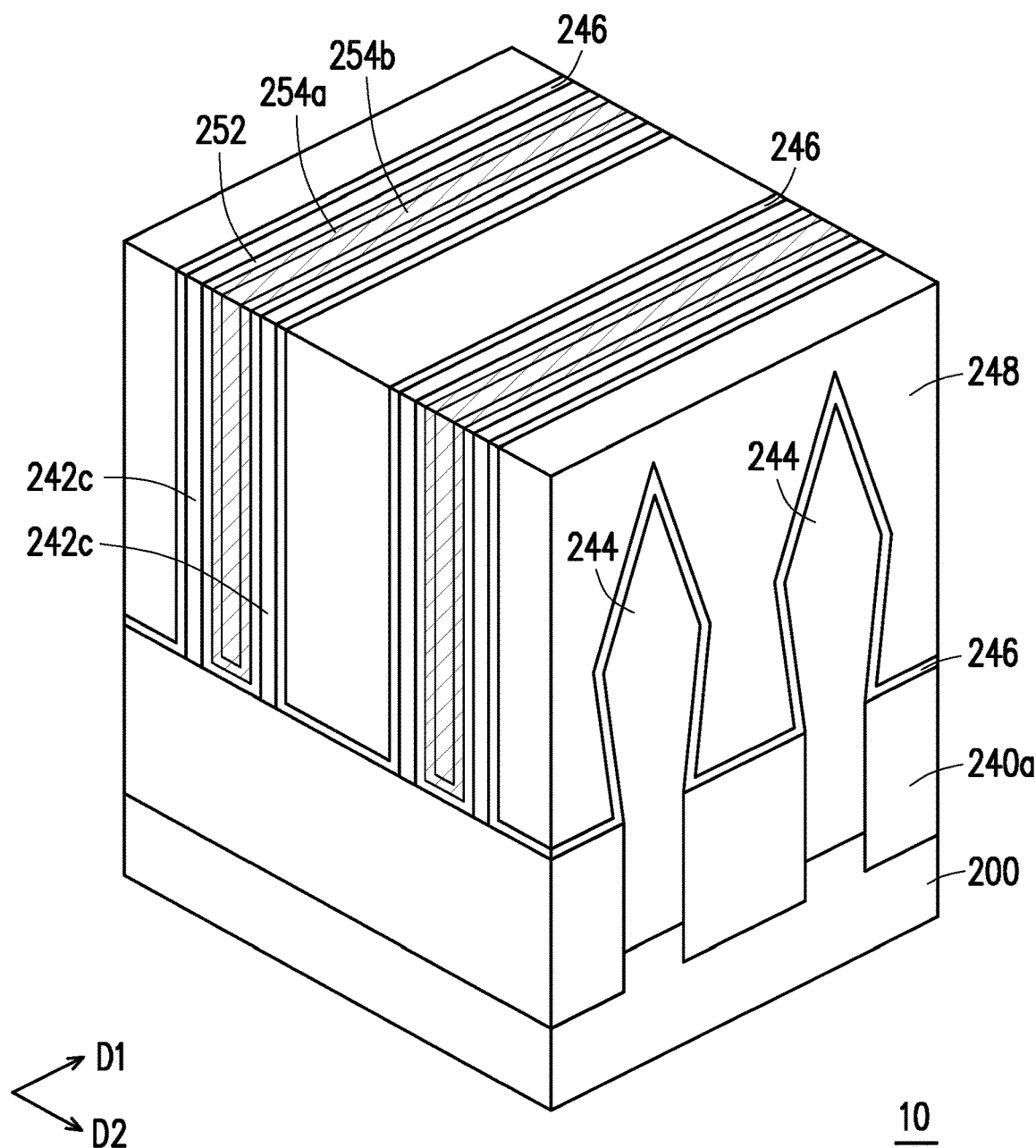

FIG. 1A to FIG. 1Q are perspective view illustrating various stages of a method of manufacturing a semiconductor device in accordance with some embodiments of the present disclosure. Referring to FIG. 1A, a semiconductor substrate 200 is provided. In some embodiments, the semiconductor substrate 200 may be a bulk semiconductor substrate, a semiconductor-on-insulator (SOI) substrate, or the like. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used.

In some embodiments, the semiconductor substrate 200 includes a crystalline silicon substrate (e.g., wafer). In some alternative embodiments, the semiconductor substrate 200 may be made of some other suitable elemental semiconductor, such as diamond or germanium; a suitable compound semiconductor, such as gallium arsenide, silicon carbide, gallium phosphide, indium phosphide, indium arsenide, and/or indium antimonide; or a suitable alloy semiconductor, such as SiGe, GaAsP, AlInAs, AlGaAs, GaInAs, GaInP, and/or GaInAsP. The semiconductor substrate 200 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or a combination thereof. In some embodiments, a dopant concentration may be equal to or less than $10^{18}$ cm$^{-3}$, such as in the range between about $10^{17}$ cm$^{-3}$ and about $10^{18}$ cm$^{-3}$. Depending on the dopant type, an n-type FinFET or a p-type FinFET may be formed on the semiconductor substrate 200 in the subsequent processes. In some embodiments, the dopant concentration in various doped regions may be different.

In some embodiments, a dielectric layer 202 is formed on the semiconductor substrate 200. In some embodiments, the dielectric layer 202 may include silicon oxide, silicon nitride, or silicon oxy-nitride. The dielectric layer 202 may be formed using a suitable process, such as Atomic Layer Deposition (ALD), Chemical Vapor Deposition (CVD), Physical Vapor Deposition (PVD), thermal oxidation, UV-ozone oxidation, or a combination thereof.

In some embodiments, a patterned pad layer 204a and a patterned mask layer 204b are sequentially formed on the dielectric layer 202. The patterned pad layer 204a and the patterned mask layer 204b may be formed by sequentially forming a pad layer and a mask layer on the dielectric layer 202 and then etching the pad layer and the mask layer by using a patterned photoresist layer. In some embodiments, a material of the patterned mask layer 204b is silicon oxide, silicon nitride, silicon oxide/silicon nitride/silicon oxide, silicon nitride/silicon oxide/silicon nitride and a combination thereof. The patterned pad layer 204a may be a silicon oxide thin film formed by, for example, a thermal oxidation process. In some embodiments, the patterned pad layer 204a may act as an adhesion layer between the semiconductor substrate 200 and the patterned mask layer 204b. In some embodiments, the patterned pad layer 204a may also act as an etch stop layer for etching the patterned mask layer 204b. In some embodiments, the patterned mask layer 204b may be a silicon nitride layer formed by low-pressure chemical vapor deposition (LPCVD) or plasma enhanced chemical vapor deposition (PECVD). In some alternative embodiments, the patterned mask layer 204b may be formed by thermal nitridation of silicon. The patterned mask layer 204b is used as a hard mask during subsequent photolithography processes.

Referring to FIG. 1B to FIG. 1H, a plurality of trenches 220 and a plurality of semiconductor fins 230 between the trenches 220 are formed. First, as shown FIG. 1B, by using the patterned mask layer 204b and the patterned pad layer 204a as a mask, portions of the semiconductor substrate 200 are etched to form a plurality of openings 206-1. In some embodiments, portions of the dielectric layer 202 are etched simultaneously with the semiconductor substrate 200. The semiconductor substrate 200 and the dielectric layer 202 may be etched through an isotropic etching process or an anisotropic etching process. For example, the semiconductor substrate 200 and the dielectric layer 202 may be etched through a reactive ion etch (RIE), a neutral beam etch (NBE), the like, or a combination thereof.

In some embodiments, a ratio of width to depth of the openings 206-1 in FIG. 1B ranges from 0.375 to 0.75. In some embodiments, widths of the openings 206-1 range from about 8 nm to about 16 nm. In some embodiments, depths of the openings 206-1 range from about 3 nm to about 6 nm. Although FIG. 1B illustrates that the openings 206-1 have straight sidewalls, the configuration merely serves as an exemplary illustration. In some alternative embodiments, the openings 206-1 may not have straight sidewalls. In other words, in some alternative embodiments, at least a portion of sidewalls of the openings 206-1 is incline or tapered.

Referring to FIG. 1C to FIG. 1F, an etching cycle is performed. The etching cycle may include a flush process F, a first etching process E1 and a second etching process E2. First, as shown in FIG. 1C, a plurality of polymer layers 208 are formed on surfaces of the openings 206-1 by the flush process F, to form openings 206-2. In some embodiments, the flush process F may be performed by using a polymer gas such as a gas containing $SO_2$ and $O_2$. During the flush process F, the polymer gas may be reacted with silicon of the semiconductor substrate 200, to form a silicon-containing polymer on the surfaces (i.e., surfaces of sidewalls 206a and bottoms 206b) of the openings 206-1. For example, when the polymer gas containing $SO_2$ and $O_2$ is used, the polymer gas may be reacted with the silicon to form a $SiO_2$—S polymer. In some embodiments, the polymer layers 208 may be $SiO_2$—S polymer layers. However, the disclosure is not limited thereto. In some alternative embodiments, the polymer gas contains at least one of nitrogen, carbon, oxygen and hydrogen element. For example, the polymer gas contains $CO_2$ and/or $N_2$.

Referring to FIG. 1D, then, the first etching process E1 is performed on the openings 206-2 (i.e., the openings 206-1 having the polymer layers 208 thereon), to form openings 206-3. The first etching process E1 may be an anisotropic etch in which a vertical etch rate is larger than a lateral etch rate. In some embodiments, the polymer layers 208 and the semiconductor substrate 200 at the sidewalls 206a and the bottoms 206b of the openings 206-1 are etched off by the first etching process E1. The polymer layers 208 may protect the fin structure from being etched or damaged by the lateral etching, so as to result a better control of fin profile. After performing the first etching process E1, compared to the openings 206-1 of FIG. 1B, the openings 206-3 of FIG. 1D may have more tapered sidewalls 206a and deeper bottoms 206b. In some embodiments, widths of the openings 206-3 range from about 8 nm to about 16 nm. In some embodiments, depths of the openings 206-3 range from about 10 nm to about 18 nm. In some embodiments, included angles θ formed between the sidewalls 206a and the bottoms 206b range from about 65 degrees to about 88 degrees. The openings 206-3 may have inverted trapezoid shape. In some embodiments, the first etching process E1 includes halogen-based etchants. For example, the first etching process E1 is a chlorine-based or a fluorine-based etching process. The chlorine-based etching process may use chlorine gas ($Cl_2$), boron trichloride gas ($BCl_3$) and/or silicon tetrachloride gas ($SiCl_4$), optionally in admixture with nitrogen gas ($N_2$) or oxygen gas ($O_2$) and a rare gas such as argon gas (Ar) or helium gas (He). The fluorine based etching process may use sulfur hexafluoride gas ($SF_6$), fluoroform gas ($CHF_3$) and/or carbon tetrafluoride gas ($CF_4$), optionally in admixture with nitrogen gas ($N_2$) or oxygen gas ($O_2$) and a rare gas such as argon gas (Ar) or helium gas (He). However, the disclosure is not limited thereto. In some alternative embodiments, other suitable etching process is used.

Referring to FIG. 1E and FIG. 1F, the second etching process E2 is performed on the openings 206-3 of FIG. 1D, to form openings 206-4. The second etching process E2 may be an isotropic etch in which a vertical etch rate is substantially the same as a lateral etch rate. It is noted that during the second etching process E2, as shown in FIG. 1E, etch by-products may be continuously deposited on upper portions 206a1 of the sidewalls 206a of the openings 206-3 to form protection layers 210. Due to the protection layers 210, compared with lower portions 206a2 of the sidewalls 206a of the openings 206-3, the upper portions 206a1 of the sidewalls 206a of the openings 206-4 may be substantially intact without being etched. In some embodiments, the second etching process E2 includes halogen-based etchants. For example, the second etching process E2 is a chlorine-based or fluorine based etching process. The chlorine-based etching process may use chlorine gas ($Cl_2$), boron trichloride gas ($BCl_3$) and/or silicon tetrachloride gas ($SiCl_4$), optionally in admixture with nitrogen gas ($N_2$) or oxygen gas ($O_2$) and a rare gas such as argon gas (Ar) or helium gas (He). The fluorine based etching process may use sulfur hexafluoride gas ($SF_6$), fluoroform gas ($CHF_3$) and/or carbon tetrafluoride gas ($CF_4$), optionally in admixture with nitrogen gas ($N_2$) or oxygen gas ($O_2$) and a rare gas such as argon gas (Ar) or helium gas (He). The protection layers 210 may be fluorine-containing polymer layers. However, the disclosure is not limited thereto. In some embodiments, the first etching process E1 uses a same etchant with that of the second etching process E2. In some embodiments, the first etching process E1 uses a different etchant from that of the second etching process E2. In some embodiments, the first etching process E1 is performed by a dry etching process or a wet etching process. In some embodiments, the second etching process E2 is performed by a dry etching process or a wet etching process. In some alternative embodiments, other suitable etching process is used.

As shown in FIG. 1F, after performing the second etching process E2, the etching cycle is finished, and openings 206-5 are formed. In some embodiments, as shown in FIG. 1F, the openings 206-5 may include portions 212 and portions 214 connected to each other. The portions 212 have inverted trapezoid shape, and the portions 214 have diamond profile, for example. In some embodiments, the portions 214 have protruding portions PP1 on sidewalls. In some embodiments, depths Dp1 of the protruding portions PP1 (i.e., vertical distance between the protruding portions PP1 and a top surface of the semiconductor substrate 200) range from about 20 nm to about 28 nm.

In some embodiments, after one etching cycle (i.e., the first etching cycle) is finished, another etching cycle (i.e., the second etching cycle) may be performed. In other words, the etching cycle is repeatedly performed. For example, the flush process is performed on the openings 206-5 of FIG. 1F, so as to form a plurality of polymer layers (not shown) on sidewall surfaces and bottom surfaces of the openings 206-5. Thus, openings 206-6 are formed. Then, the first etching process and the second etching process are sequentially performed on the openings. In some embodiments, after the second etching cycle is finished, as shown in FIG. 1G, a plurality of portions 216 are formed to connect with the portions 214 and the portions 212 of the openings 206-6. The portions 216 may have diamond profile similar to the portions 214. The portions 216 have protruding portions PP2 on sidewalls of the portions 216. In some embodiments, depths Dp2 of the protruding portions PP2 (i.e., vertical distance between the protruding portions PP2 and the top surface of the semiconductor substrate 200) range from about 50 nm to about 60 nm. In some embodiments, the etching cycle is performed twice. However, the disclosure is not limited thereto. In some alternative embodiments, the etching cycle is performed once or more than twice. Additionally, in some alternative embodiments, the flush process may be omitted in at least one etching cycle.

Figure 2:
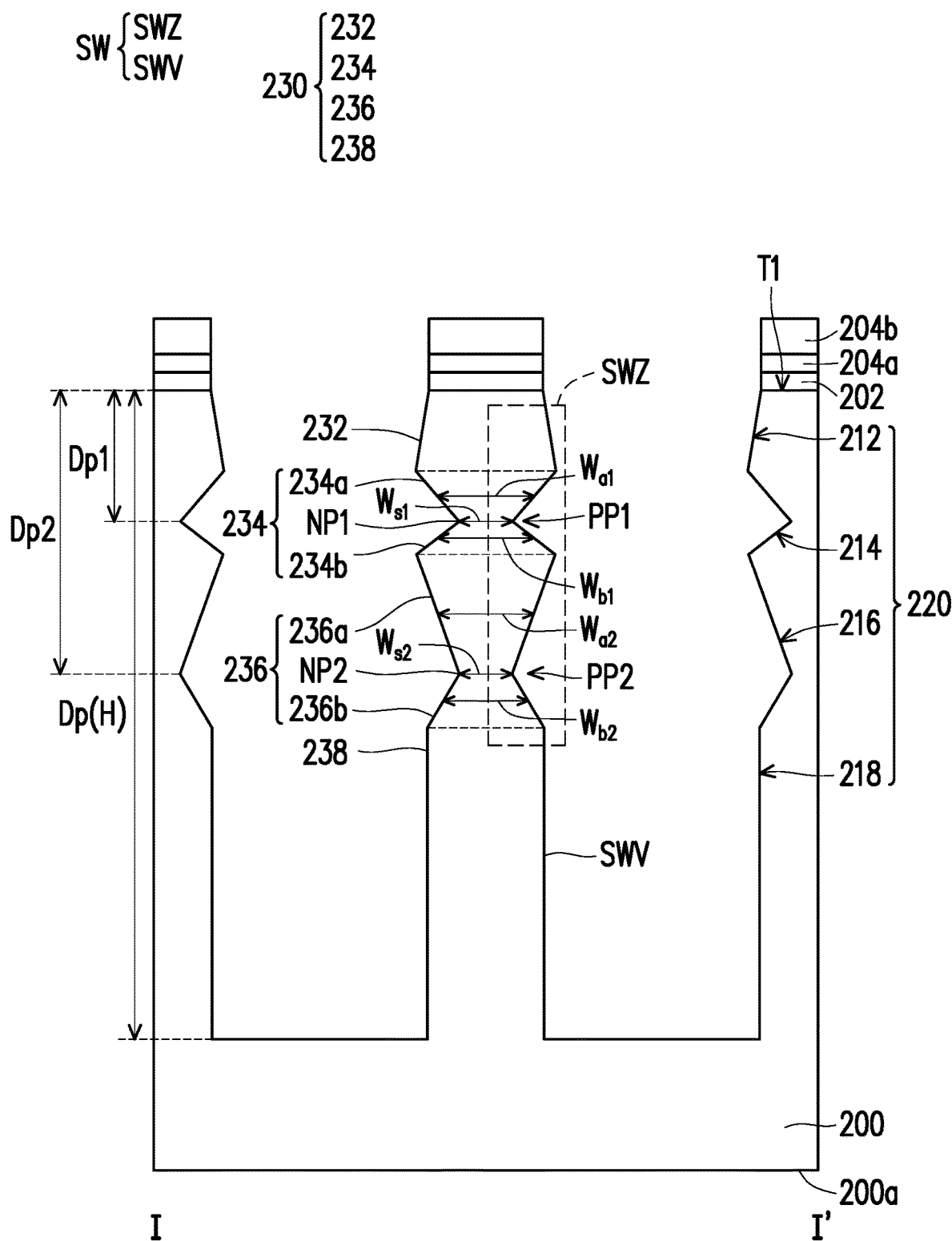
FIG. 2 is a cross-sectional view of the semiconductor device taken along line I-I' of FIG. 1H.

FIG. 2 is a cross-sectional view of the semiconductor device taken along line I-I' of FIG. 1H. Referring to FIG. 1H and FIG. 2, after performing the etching cycle(s), by using the patterned mask layer 204b and the patterned pad layer 204a, the openings 206-6 of FIG. 1G are deepened to a predetermined depth Dp, to form openings 206-7. In some embodiments, portions of the semiconductor substrate 200 are etched to form a plurality of portions 218. The semiconductor substrate 200 may be etched through an isotropic etching process or an anisotropic etching process. For example, the semiconductor substrate 200 may be etched through a reactive ion etch (RIE), a neutral beam etch (NBE), the like, or a combination thereof. In some embodiments, before forming the portions 218, a flush process is performed to form a plurality of polymer layers over the surfaces of the openings 206-6 of FIG. 1G. Although FIG. 1H and FIG. 2 illustrate that the portions 218 have straight sidewalls and flat bottoms, the configuration merely serves as an exemplary illustration. In some alternative embodiments, the portions 218 may not have straight sidewalls and/or flat bottoms. In other words, in some alternative embodiments, at least a portion of sidewalls of the portions 218 is inclined or tapered. Furthermore, in some alternative embodiments, at least a portion of the bottoms of the portions 218 is recessed.

As shown in FIG. 1H and FIG. 2, after forming the portions 218, the trenches 220 are formed, and the semiconductor fins 230 are formed between the trenches 220. In other words, the configuration of the semiconductor fins 230 is defined by the profile of the trenches 220. In some embodiments, by performing at least one etching cycle, the trenches 220 are formed with the protruding portions PP1, PP2. Correspondingly, the semiconductor fins 230 are formed with neck portions NP1, NP2. In some embodiments, the semiconductor fins 230 have portions 232, portions 234, portions 236 and portions 238. The configuration of the portions 232, the portions 234, the portions 236 and the portions 238 are corresponding to the profile of the portions 212, the portions 214, the portions 216 and the portions 218 respectively. For example, the portions 232 have inverted trapezoid shape, the portions 234 have narrow-middle profile, the portions 236 have narrow-middle profile and the portions 238 have straight profile. The portions 234 and the portions 236 have the neck portions NP1, NP2. In some embodiments, the portions 234 include portions 234a (also referred to as first portions), portion 234b (also referred to as second portions) and the neck portions NP1 (also referred to as first neck portions) between the portions 234a and portions 234b. A width $W_{a1}$ of the portion 234a decreases as the portion 234a becomes closer to the neck portion NP1, and a width $W_{b1}$ of the portion 234b increases as the portion 234b becomes closer to a bottom surface 200a of the semiconductor substrate 200. Similarly, the portions 236 include portions 236a (also referred to as third portions), portion 236b (also referred to as fourth portions) and the neck portions NP2 (also referred to as second neck portions) between the portions 236a and portions 236b. The portion 236a and the portion 236b are disposed between the portion 234b and the semiconductor substrate 200. A width $W_{a1}$ of the portion 236a decreases as the portion 236a becomes closer to the neck portion NP2, and a width $W_{b2}$ of the portion 236b increases as the portion 236b becomes closer to the bottom surface 200a of the semiconductor substrate 200.

As shown in FIG. 2, the neck portions NP1, NP2 make the semiconductor fins 230 have significantly shrinking widths. In other words, the neck portions NP1, NP2 of the semiconductor fins 230 have smaller widths $W_{s1}$, $W_{s2}$ than other portions. In some embodiments, one of the widths $W_{s1}$, $W_{s2}$ of the semiconductor fins 230 may be the minimum width of the semiconductor fins 230. The widths $W_{s1}$, $W_{s2}$ of the semiconductor fins 230 range from about 5 nm to 7 nm, for example. Widths of the portions 232, 238 range from about 5 nm to 7 nm, for example. A ratio of the widths $W_{s1}$, $W_{s2}$ of the neck portions NP1, NP2 (also referred to as recessed portions) to the widths of the portions 232, 238 (also referred to as un-recessed portions) may range from about 0.75 to 1. The necking profile is used to reduce the $I_{off}$ current, when the ratio is less than 0.75, the fin bending risk is high, when the ratio is more than 1, the $I_{off}$ reduction efficiency is low.

In some embodiments, as shown in FIG. 2, sidewalls SW of the semiconductor fins 230 include zig-zag portions SWZ and substantially vertical portions SWV. The substantially vertical portions SWV are substantially vertical (i.e., slightly inclined or slightly tapered) to the bottom surface 200a of the semiconductor substrate 200. The substantially vertical portions SWV may be physically connected to the zig-zag portions SWZ. In some embodiments, the substantially vertical portions SWV are disposed between the semiconductor substrate 200 and the zig-zag portions SWZ. In other words, the zig-zag portions SWZ form upper portions of the sidewalls SW. However, the disclosure is not limited thereto. In some alternative embodiments, the zig-zag portions SWZ form middle portions of the sidewall SW, that is, the zig-zag portions SWZ are disposed between upper portions and lower portions. The upper portions and/or the lower portions may be the substantially vertical portion SWV. In some embodiments, a ratio (i.e., a height ratio) of the zig-zag portion SWZ to the sidewall SW ranges from 1/3 to 1/2. Since the electrical leakage is liable to occur at a location ranging from about 1/3 to 1/2 of the fin (e.g., 16 nm-25 nm of fin height) of the FinFET structure, the necking profile forming at the location ranging from about 1/3 to 1/2 of the fin of the FinFET structure may reduce the electrical leakage efficiently.

In some embodiments, the neck portions NP1 (i.e., the topmost neck portions) are configured adjacent to turning points of source/drain structure (i.e., turning points TP of source/drain structures 244 as shown in FIG. 1N). For example, when heights H of the semiconductor fins 230 range from about 110 nm to about 120 nm, distances between the neck portions NP1 and top surfaces T1 of the semiconductor fins 230 range from 24 nm to 28 nm. In other words, when the depths Dp of the trenches 220 range from about 110 nm to about 120 nm, the depths Dp1 of the protruding portions PP1 range from 24 nm to 28 nm. Although FIG. 1H and FIG. 2 illustrate that the semiconductor fins 230 have two neck portions NP1, NP2, the configuration merely serves as an exemplary illustration. In some alternative embodiments, the semiconductor fins 230 may have only one or more than two neck portions. In other words, the etching cycle may be performed once or more than twice. In some embodiments, P wells (not shown) or N wells may be formed in the semiconductor fins 230 or the semiconductor substrate 200.

Referring to FIG. 1I, an insulating material 240 is formed over the semiconductor substrate 200. In some embodiments, the insulating material 240 fills up the trenches 220 and covers the semiconductor fins 230, the patterned pad layer 204a, and the patterned mask layer 204b. The insulating material 240 may include silicon oxide, silicon nitride, silicon oxynitride, a spin-on dielectric material, or a low-k dielectric material. The low-k dielectric materials are generally referring to dielectric materials having a dielectric constant lower than 3.9. The insulating material 240 may be formed by High Density Plasma Chemical Vapor Deposition (HDPCVD), Sub Atmospheric Chemical Vapor Deposition (SACVD), spin-on, or other suitable processes.

Referring to FIG. 1J, a planarization process is performed on the insulating material 240. In some embodiments, a portion of the insulating material 240 is removed to form a polished insulating material 240'. The planarization process includes, for example, a chemical mechanical polish (CMP) process, an etch back process, combinations thereof, or the like. In some embodiments, after the insulating material 240 is planarized, a top surface of the polished insulating material 240' is substantially coplanar with a top surface of the patterned mask layer 204b. In other words, the top surfaces of the semiconductor fins 230 are protected by the dielectric layer 202, the patterned pad layer 204a and the patterned mask layer 204b and are not revealed.

Referring to FIG. 1K, the polished insulating material 240' filled in the trenches 220 is partially removed by an etching process to form a plurality of insulators 240a in the trenches 220. In some embodiments, the polished insulating material 240' may be etched off by a wet etching process with hydrofluoric acid (HF). Alternatively, the polished insulating material 240' may be etched off by a dry etching process with HF 3 and NH 3 gases. During the dry etching process, plasma may be generated and Argon may also be included. As illustrated in FIG. 1K, each semiconductor fin 230 is sandwiched between two adjacent insulators 240a. In some embodiments, top surfaces T2 of the insulators 240a are lower than the top surfaces T1 of the semiconductor fins 230. The top surfaces T2 of the insulators 240a may be lower than the neck portions NP2 (i.e., the bottommost neck portions). For example, the semiconductor fins 230 protrude from the top surfaces T2 of the insulators 240a. In some embodiments, a height difference between the top surfaces T1 of the semiconductor fins 230 and the top surfaces T2 of the insulators 240a ranges from about 15 nm to about 50 nm. In some embodiments, the insulators 240a may be referred to as "Shollow Trench Isolation (STI)." In some embodiments, the top surfaces T2 of the insulators 240a may have a flat surface, a convex surface, a concave surface, or a combination thereof.

Referring to FIG. 1L, a plurality of dummy gate structures 242 is formed over a portion of the semiconductor fins 230 and a portion of the insulators 240a. In some embodiments, the dummy gate structures 242 are formed across the semiconductor fins 230. For example, an extending direction D1 of the dummy gate structures 242 may be perpendicular to an extending direction D2 of the semiconductor fins 230. In some embodiments, each dummy gate structure 242 includes a dummy gate dielectric layer 242a, a dummy gate 242b disposed over the dummy gate dielectric layer 242a, and a mask layer 242d disposed over the dummy gate 242b. In some embodiments, the dummy gate dielectric layer 242a is conformally formed over a portion of the insulators 240a and a portion of the semiconductor fins 230. In some embodiments, the dummy gate dielectric layer 242a may include silicon oxide, silicon nitride, or silicon oxy-nitride. The dummy gate dielectric layer 242a may be formed using a suitable process, such as Atomic Layer Deposition (ALD), Chemical Vapor Deposition (CVD), Physical Vapor Deposition (PVD), thermal oxidation, UV-ozone oxidation, or a combination thereof. The dummy gate dielectric layer 242a may be formed to separate the semiconductor fins 230 and the dummy gate 242b and to function as an etching stop layer.

As illustrated in FIG. 1L, the dummy gate 242b is formed on the dummy gate dielectric layer 242a. In some embodiments, the dummy gate 242b may be a single-layered structure or a multi-layered structure. In some embodiments, the dummy gate 242b includes a silicon-containing material, such as poly-silicon, amorphous silicon, or a combination thereof. In some embodiments, a thickness of the dummy gate 242b ranges between 30 nm and 90 nm. The dummy gate 242b may be formed by a suitable process, such as ALD, CVD, PVD, plating, or a combination thereof. In some embodiments, the mask layer 242d is formed on the dummy gate 242b. In some embodiments, the mask layer 242d may be formed of silicon nitride, silicon oxide, silicon carbo-nitride, combinations thereof, or the like.

In addition to the dummy gate structures 242, multiple pairs of spacers 242c are also formed over portions of the semiconductor fins 230 and portions of the insulators 240a. As illustrated in FIG. 1L, the spacers 242c are disposed on sidewalls of the dummy gate structures 242. For example, the dummy gate dielectric layer 242a, the dummy gate 242b, and the mask layer 242d are sandwiched between a pair of spacers 242c. In some embodiments, the spacers 242c and the dummy gate structures 242 have the same extending direction D1. Similar to the dummy gate structures 242, the spacers 242c are also formed across the semiconductor fins 230. In some embodiments, the spacers 242c are formed of dielectric materials, such as silicon oxide, silicon nitride, carbonized silicon nitride (SiCN), SiCON, or a combination thereof. In some embodiments, the spacers 242c may be formed by a thermal oxidation or a deposition followed by an anisotropic etch. It should be noted that the spacers 242c may be a single-layered structure or a multi-layered structure.

Referring to FIG. 1M, the semiconductor fins 230 exposed by the dummy gate structure 242 and the spacers 242c are removed/recessed to form a plurality of recessed regions R, and then a plurality of source/drain structures 244 are grown over the recessed regions R of the semiconductor fins 230 and extends beyond the top surfaces of the insulators 240a. Portions of the semiconductor fins 230 may be removed by, for example, anisotropic etching, isotropic etching, or a combination thereof. In some embodiments, portions of the semiconductor fins 230 are recessed below the top surfaces T2 of the insulators 240a. In other words, the semiconductor fins 230 exposed by the dummy gate structure 242 and the spacers 242c are not entirely removed. As illustrated in FIG. 1M, the semiconductor fins 230 covered by the dummy gate structure 242 and the spacers 242c are not etched and are exposed at sidewalls of the spacers 242c.

Referring to FIG. 1N, a plurality of source/drain structures 244 are grown over the recessed regions R of the semiconductor fins 230 and extends beyond the top surfaces T2 of the insulators 240a. That is, the source/drain structures 244 are formed over portions of the semiconductor fins 230 revealed by the dummy gate structure 242 and the spacers 242c. In some embodiments, the source/drain structures 244 are grown to strain or stress the semiconductor fins 230. In some embodiments, the source/drain structures 244 are formed such that each dummy gate structure 242 is disposed between respective neighboring pairs of the source/drain structures 244. For example, the source/drain structures 244 include a source disposed at a side of one of the spacers 242c and a drain disposed at a side of another one of the spacers 242c. As illustrated in FIG. 1N, the dummy gate structures 242 are separated from the neighboring source/drain structures 244 by the corresponding spacers 242c. As such, appropriate lateral distance is maintained between the dummy gate structures 242 and the source/drain structures 244, so the source/drain structures 244 do not short out with the subsequently formed gates of the resulting device.

In some embodiments, the source/drain structures 244 have diamond profile. Thus, sidewalls of the source/drain structures 244 have turning points TP (also referred to as source/drain proximity push points). In some embodiments, the neck portions NP1 of the semiconductor fins 230 are designed adjacent to the turning points TP of the source/drain structures 244. For example, heights H1 of the neck portions NP1 (as shown in FIG. 1M) of the semiconductor fins 230 are substantially equal to heights H2 (as shown in FIG. 1N) of the turning points TP of the source/drain structures 244. Accordingly, the electrical leakage occurring at the turning points TP of the source/drain structures 244 may be significantly lowered.

In some embodiments, the source/drain structures 244 may be doped with a conductive dopant. In some embodiments, the source/drain structures 244, such as SiGe, SiGeB, Ge, GeSn, or the like, are epitaxial-grown with p-type dopants for straining a p-type FinFET. That is, the source/drain structures 244 are doped with the p-type dopants to be the source and the drain of the p-type FinFET. The p-type dopants include boron or $BF_2$. In some alternative embodiments, the source/drain structures 244, such as SiC, SiP, SiCP, a combination of SiC/SiP, or the like, are epitaxial-grown with n-type dopants for straining an n-type FinFET. That is, the source/drain structures 244 are doped with the n-type dopants to be the source and the drain of the n-type FinFET. The n-type dopants include arsenic and/or phosphorus. In some embodiments, the source/drain structures 244 may be epitaxial-grown by LPCVD process with in-situ doping. In some embodiments, a concentration of the dopant in the source/drain structures 244 may range between about $10^{19}$ cm$^{-3}$ and about $10^{21}$ cm$^{-3}$. Depending on the type of the device, the source/drain structures 244 in different regions may be doped with different type of dopants. Similarly, depending on the function of the device, the source/drain structures 244 in different regions may be doped with different dopant concentrations. In some embodiments, each of the source/drain structures 244 may be a single-layered structure or a multi-layered structure.

As mentioned above, the source/drain structures 244 may include SiGe, SiGeB, Ge, GeSn, SiC, SiP, SiCP, a combination of SiC/SiP, or the like. However, the disclosure is not limited thereto. In some alternative embodiments, the source/drain structures 244 may also include III-V compound semiconductors, such as GaAs, InP, GaN, InGaAs, InAlAs, GaSb, AlSb, AlAs, AlP, GaP, or a combination thereof. After the source/drain structures 244 are grown to reach the top surfaces of the insulators 240a, the epitaxial growth of the source/drain structures 244 continues. In some embodiments, the source/drain structures 244 above the top surfaces of the insulators 240a expand horizontally and facets are formed for each of the source/drain structures 244. As shown in FIG. 1N, the source/drain structures 244 are separated from each other. However, the disclosure is not limited thereto. In some alternative embodiments, the further growth of the source/drain structures 244 above the top surfaces of the insulators 240a may cause neighboring source/drain structures 244 to merge with each other.

It should be noted that the recess step illustrated in FIG. 1M may be omitted in some embodiments. For example, the source/drain structures 244 may be formed on the un-recessed semiconductor fins 230. That is, the source/drain structures 244 may be formed on the un-recessed semiconductor fins 230.

Referring to FIG. 1O, an etch stop layer 246 and an interlayer dielectric layer 248 are sequentially formed over the source/drain structures 244 and the insulators 240a. In some embodiments, the etch stop layer 246 is formed adjacent to the spacers 242c. The etch stop layer 246 may be conformally formed on the top surfaces of the insulators 240a and the source/drain structures 244. That is, the etch stop layer 246 follows the profile (the facet) of the source/drain structures 244. In some embodiments, the etch stop layer 246 may be formed of silicon oxide, silicon nitride, silicon carbo-nitride, or the like. In some embodiments, the etch stop layer 246 may be formed through, for example, CVD, SACVD, Molecular Layer Deposition (MLD), ALD, or the like. In some embodiments, the etch stop layer 246 may be referred to as "contact etch stop layer (CESL)."

As shown in FIG. 1O, the interlayer dielectric layer 248 is formed on the etch stop layer 246. In some embodiments, the interlayer dielectric layer 248 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some alternative embodiments, the interlayer dielectric layer 248 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the interlayer dielectric layer 248 may include one or more dielectric materials and/or one or more dielectric layers. In some embodiments, the interlayer dielectric layer 248 is formed to a suitable thickness by Flowable Chemical Vapor Deposition (FCVD), CVD, HDPCVD, SACVD, spin-on, sputtering, or other suitable methods. For example, an interlayer dielectric material layer (not shown) may be formed to cover the etch stop layer 246, the dummy gate structures 242, and the spacers 242c. Subsequently, the thickness of the interlayer dielectric material layer is reduced until a top surface of the dummy gate structure 242 is exposed, so as to form the interlayer dielectric layer 248. The reduction the thickness of the interlayer dielectric material layer may be achieved by a chemical mechanical polishing (CMP) process, an etching process, or other suitable processes. After reducing the thickness of the interlayer dielectric material layer, top surfaces of the dummy gate structures 242, top surfaces of the spacers 242c, and a top surface of the interlayer dielectric layer 248 are substantially coplanar.

Referring to FIG. 1P, the dummy gate structures 242 are removed to form hollow portions 249 exposing a portion of the semiconductor fins 230. For example, the mask layer 242d, the dummy gate 242b, and the dummy gate dielectric layer 242a are removed to form hollow portions 249 between two adjacent spacers 242c. In some embodiments, the exposed portion of the semiconductor fins 230 may act as channel regions of the semiconductor fins 230. In some embodiments, the dummy gate structures 242 are removed through an etching process or other suitable processes. The etching process includes, for example, a wet etching process or a dry etching process. Example of the wet etching process includes chemical etching and example of the dry etching process includes plasma etching. However, other commonly known etching methods may also be utilized to remove the dummy gate structures 242. In some embodiments, during the etching process of the dummy gate 242b, the underlying dummy gate dielectric layer 242a may act as an etch stop layer. The dummy gate dielectric layer 242a may be removed after the removal of the dummy gate 242b.

Referring to FIG. 1Q, a gate dielectric layer 252, a work function layer 254a, and a metal layer 254b are sequentially deposited into the hollow portions 249 to form gate structures 250. For example, each gate structure 250 is located in the corresponding hollow portion 249 and is sandwiched between the neighboring spacers 242c. As illustrated in FIG. 1Q, the gate structures 250 are disposed across the semiconductor fins 230. For example, the gate structures 250 are disposed over the channel regions of the semiconductor fins 230. The source/drain structures 244 are disposed at opposite sides of the gate structures 250. In some embodiments, the work function layer 254a and the metal layer 254b may be collectively referred to as a gate 254 of the gate structure 250. In some embodiments, the gate dielectric layer 252 is conformally deposited into the hollow portion 249. For example, the gate dielectric layer 252 covers the top surface and the sidewalls of the semiconductor fins 230 exposed by the hollow portion 249. Meanwhile, the gate dielectric layer 252 also covers sidewalls of the spacers 242c and the top surfaces of the insulators 240a. In some embodiments, a material of the gate dielectric layer 252 may be identical to or different from the material of the dummy gate dielectric layer 242a. For example, the gate dielectric layer 252 includes silicon oxide, silicon nitride, silicon oxynitride, or a combination thereof. In some alternative embodiments, the gate dielectric layer 252 is made of a high-k dielectric material. In some embodiments, the high-k dielectric material refers to dielectric materials having a dielectric constant greater than about 7.0, and may include a metal oxide or a silicate of Hf, Al, Zr, La, Mg, Ba, Ti, Pb, and combinations thereof. In some embodiments, the gate dielectric layer 252 may be formed by, for example, Molecular-Beam Deposition (MBD), ALD, PECVD, thermal oxidation, UV-ozone oxidation, a combination thereof, or the like. In some embodiments, the gate dielectric layer 252 may further include an interfacial layer (not shown). In some embodiments, the interfacial layer may be used in order to create a good interface between the semiconductor fins 230 and the gate 254, as well as to suppress the mobility degradation of the channel carrier of the subsequently formed semiconductor device. In some embodiments, the interfacial layer is formed by a thermal oxidation process, a CVD process, or an ALD process. The interfacial layer includes, for example, silicon oxide or silicon oxynitride. In some embodiments, a liner layer, a seed layer, an adhesion layer, or a combination thereof may be further included between the gates 254 and the semiconductor fins 230.

As illustrated in FIG. 1Q, the work function layer 254a is conformally disposed on the gate dielectric layer 252. In some embodiments, the work function layer 254a includes p-type or n-type work function metals. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. On the other hand, exemplary n-type work function metals include Ti, Ag, TaAl, TaAlC, TiAlN, TaC, TaCN, TaSiN, Mn, Zr, other suitable n-type work function materials, or combinations thereof. In some embodiments, the work function layer 254a may be formed by, for example, CVD, PECVD, ALD, Remote Plasma Atomic Layer Deposition (RPALD), Plasma-Enhanced Atomic Layer Deposition (PEALD), MBD, or the like. In some embodiments, the work function layer 254a may serve the purpose of adjusting threshold voltage (Vt) of the subsequently formed semiconductor device.

The metal layer 254b is disposed on the work function layer 254a. In some embodiments, the metal layer 254b may include tungsten, cobalt, or the like. In some embodiments, precursor gases for forming the tungsten metal layer 254b may include tungsten hexafluoride ($WF_6$), silane ($SiH_4$), and/or hydrogen ($H_2$). In some embodiments, the metal layer 254b is formed through CVD. In some embodiments, a barrier layer (not shown) may exist between the metal layer 254b and the work function layer 254a. The barrier layer includes, for example, TiN or the like and is formed through ALD.

During the formation of the gate dielectric layer 252, the work function layer 254a, and the metal layer 254b, excessive portions of these layers may be formed outside of the hollow portion 249. For example, excessive portions of these layers are formed on the etch stop layer 246 and the interlayer dielectric layer 248. As such, a planarization process, such as a CMP process, may be performed to remove excessive portions of these layers to render the structure illustrated in FIG. 1Q. As illustrated in FIG. 1Q, the gate dielectric layer 252 and the work function layer 254a have U-shaped cross-sectional views.

The steps illustrated in FIG. 1O to FIG. 1Q is commonly referred to as a "metal gate replacement process." In some embodiments, the dummy gate structure 242 including polysilicon is replaced by the gate structure 250 which includes metal. In some embodiments, a semiconductor device 10 is formed, and the semiconductor device 10 may be referred to as a "Fin Field-effect transistor (FinFET)."

In some embodiments, by performing at least one etching cycle including the flush process, the first etching process and the second etching process, the semiconductor fin is formed with at least one neck portion. In addition, by designing the neck portion adjacent to the turning point of the source/drain structure, the electrical leakage occurring at the protruding portion of the source/drain structure may be significantly lowered.

In accordance with some embodiments of the disclosure, a semiconductor device includes a semiconductor substrate, at least one semiconductor fin and a gate stack. The semiconductor fin is disposed on the semiconductor substrate. The semiconductor fin includes a first portion, a second portion and a first neck portion between the first portion and the second portion. A width of the first portion decreases as the first portion becomes closer to the first neck portion, and a width of the second portion increases as the second portion becomes closer to a bottom surface of the semiconductor substrate. The gate stack partially covers the semiconductor fin.

In accordance with some embodiments of the disclosure, a semiconductor device includes a semiconductor substrate, at least one semiconductor fin and a gate stack. The semiconductor fin is disposed on the semiconductor substrate. A sidewall of the semiconductor fin includes a zig-zag portion. The gate stack partially covers the semiconductor fin.

In accordance with some embodiments of the disclosure, a method of manufacturing a semiconductor device includes at least the following steps. A plurality of openings are formed in a semiconductor substrate. At least one etching cycle is performed on the plurality of openings to form a plurality of trenches and at least one semiconductor fin between the trenches. The etching cycle includes: forming a plurality of polymer layers on surfaces of the openings; performing a first etching process on the openings; and performing a second etching process on the openings while upper sidewalls of the openings are covered by a by-product formed during the second etching process. A plurality of insulators are formed in the trenches. A gate stack is formed to partially cover the semiconductor fin and the insulators.

In accordance with some embodiments of the disclosure, a method of manufacturing a semiconductor device includes at least the following steps. A protrusion is formed in a substrate by an anisotropic etch process, wherein a sidewall of the protrusion is inclined. A recess is formed on the sidewall of the protrusion by an isotropic etch process, wherein during the isotropic etch process, a by-product covers a first portion of the sidewall of the protrusion while exposing a second portion of the sidewall of the protrusion, so that the recess is formed between the first portion and the second portion of the sidewall.

In accordance with some embodiments of the disclosure, a method of manufacturing a semiconductor device includes at least the following steps. A semiconductor fin is formed between a plurality of insulators, the semiconductor fin comprising a first neck at a first height relative to top surfaces of the insulators. A first portion of a source/drain structure is formed from a second height to the first height, wherein the first portion of the source/drain structure has an increasing slope. A second portion of the source/drain structure is formed, wherein the second portion of the source/drain structure has a decreasing slope. A gate stack is formed to partially cover the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a plurality of openings in a substrate;
    reacting a gas with a material of the substrate, to form a plurality of polymer layers on exposed surfaces of the openings;
    performing an anisotropic etch process on the openings with the polymer layers thereon, to simultaneously remove the polymer layers on sidewalls of the openings and portions of the substrate to deepen a depth of the openings and form a protrusion between the openings; and
    forming a recess on a sidewall of the protrusion by an isotropic etch process, wherein during the isotropic etch process, a by-product covers a first portion of the sidewall of the protrusion while exposing a second portion of the sidewall of the protrusion, so that the recess is formed between the first portion and the second portion of the sidewall.

2. The method according to claim 1, wherein reacting the gas with the material of the substrate comprises performing a flush process by using the gas.

3. The method according to claim 1, wherein the material of the substrate comprises silicon.

4. The method according to claim 1, wherein the first portion of the sidewall is an upper portion, and the second portion of the sidewall is a lower portion.

5. The method according to claim 1, wherein the gas comprises $SO_2$, $O_2$, $CO_2$, $N_2$ or a combination thereof.

6. A method of manufacturing a semiconductor device, comprising:
    forming a plurality of openings in a semiconductor substrate;
    performing at least one etching cycle on the plurality of openings to form a plurality of trenches and at least one semiconductor fin between the trenches, the etching cycle comprising:
        by performing a flush process, forming a plurality of polymer layers on bottom and sidewall surfaces of the plurality of openings;
        after performing the flush process, performing a first etching process to remove the polymer layers and the substrate therebelow, to deepen a depth of the plurality of openings; and
        performing a second etching process on the plurality of openings to deepen a depth of the openings, while the second etching process is performed, etch by-products from the second etching process respectively deposit on upper portions of the openings to form second protection layers and protect the upper portions of the openings;

forming a plurality of insulators in the plurality of trenches; and forming a gate stack to partially cover the at least one semiconductor fin and the plurality of insulators.

7. The method according to claim 6, wherein the flush process is performed by using a gas.

8. The method according to claim 7, wherein the gas contains $SO_2$ and $O_2$.

9. The method according to claim 6, wherein the first etching process is an anisotropic etch process, and the second etching process is an isotropic etch process.

10. The method according to claim 6, wherein the first etching process is a chlorine based dry etching process, and the second etching process is a fluorine based dry etching process.

11. The method according to claim 6, wherein after performing the first etching process, the plurality of openings comprise inclined sidewalls.

12. The method according to claim 6, wherein the plurality of trenches comprise diamond-shaped openings formed by the second etching process.

13. The method according to claim 6, wherein a method of forming the plurality of openings in the semiconductor substrate comprises:

forming a patterned pad layer over the substrate; and forming the plurality of openings by using the patterned pad layer as a mask.

14. The method according to claim 6, after performing the at least one etching cycle, further comprising deepening the plurality of openings to a predetermined depth.

15. The method according to claim 6 further comprising forming a source/drain structure on opposite sides of the gate stack.

16. The method according to claim 6, wherein a neck portion is formed in the at least one semiconductor fin after performing one etching cycle of the at least one etching cycle.

17. A method of manufacturing a semiconductor device, comprising:

forming an opening in a substrate;

reacting a gas with the substrate, to form a first protection layer on an exposed surface of the opening;

performing a first etching process on the opening with the first protection layer thereon, to simultaneously remove the first protection layer on a sidewall of the opening and a portion of the substrate to deepen a depth of the opening; and performing a second etching process on the opening, to enlarge a width of a lower portion of the opening.

18. The method according to claim 17, wherein during the second etching process, etch by-products from the second etching process deposit on an upper portion of the opening to form a second protection layer and protect the upper portions of the opening.

19. The method according to claim 17, wherein the lower portion of the opening has a width larger than an upper portion of the opening.

20. The method according to claim 17, wherein the gas comprises $SO_2$, $O_2$ or a combination thereof.

* * * * *